United States Patent
Shin et al.

(10) Patent No.: US 11,899,294 B2
(45) Date of Patent: Feb. 13, 2024

(54) LIGHT PATH CONTROL MEMBER AND DISPLAY DEVICE COMPRISING SAME

(71) Applicant: LG INNOTEK CO., LTD., Seoul (KR)

(72) Inventors: Jun Sik Shin, Seoul (KR); Jong Sik Lee, Seoul (KR); Jong Tae Kwon, Seoul (KR); Byung Sook Kim, Seoul (KR); Jin Gyeong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/043,475

(22) PCT Filed: Aug. 17, 2021

(86) PCT No.: PCT/KR2021/010893
§ 371 (c)(1),
(2) Date: Feb. 28, 2023

(87) PCT Pub. No.: WO2022/050597
PCT Pub. Date: Mar. 10, 2022

(65) Prior Publication Data
US 2023/0341714 A1 Oct. 26, 2023

(30) Foreign Application Priority Data

Sep. 3, 2020 (KR) .................. 10-2020-0112121
Nov. 19, 2020 (KR) .................. 10-2020-0155478

(51) Int. Cl.
*G02F 1/13* (2006.01)
*G02F 1/1339* (2006.01)

(52) U.S. Cl.
CPC .......... *G02F 1/1323* (2013.01); *G02F 1/1339* (2013.01)

(58) Field of Classification Search
CPC ............. G02F 1/1323; G02F 1/1339
See application file for complete search history.

(56) References Cited

U.S. PATENT DOCUMENTS 11,042,072 B2* 6/2021 Shiota .................. G02F 1/167
2014/0034496 A1 2/2014 Mueller et al.

FOREIGN PATENT DOCUMENTS

JP 2007-78792 A 3/2007
JP 2019-139207 A 8/2019
(Continued)

OTHER PUBLICATIONS

International Search Report dated Dec. 1, 2021 in International Application No. PCT/KR2021/010893.

*Primary Examiner* — Anne M Hines
*Assistant Examiner* — Jose M Diaz
(74) *Attorney, Agent, or Firm* — Saliwanchik, Lloyd & Eisenschenk

(57) ABSTRACT

A light path control member according to an embodiment comprises: a first substrate; a first electrode disposed on the first substrate; a second substrate disposed on the first substrate; a second electrode disposed under the second substrate; a light conversion unit disposed between the first electrode and the second electrode; an adhesive layer between the second electrode and the light conversion unit; and a buffer layer between the first electrode and the light conversion unit. The light conversion unit includes a plurality of partition wall portions, a plurality of accommodation portions, and a base portion. The accommodation portions have a light conversion material disposed therein, and include at least two sealing regions formed on at least one of the first substrate or the second substrate. The accommodation portions are arranged to extend in a second direction, and include movement portions connected to the accommodation portions and extending in a first direction different from the second direction. The movement portions are connected to the sealing regions and the accommodation portions. The sealing regions pass through the first substrate, the first electrode, and the buffer layer or through the second (Continued)

substrate, the second electrode, and the adhesive layer. The sealing regions overlap the movement portion.

18 Claims, 20 Drawing Sheets

(56) References Cited

FOREIGN PATENT DOCUMENTS

| | | |
|---|---|---|
| KR | 10-2012-0033790 A | 4/2012 |
| KR | 10-2012-0089518 A | 8/2012 |
| KR | 10-2013-0110173 A | 10/2013 |
| KR | 10-2014-0095669 A | 8/2014 |
| KR | 10-2018-0004879 A | 1/2018 |

* cited by examiner

LIGHT PATH CONTROL MEMBER AND DISPLAY DEVICE COMPRISING SAME

CROSS-REFERENCE TO RELATED APPLICATIONS

This application is the U.S. national stage application of International Patent Application No. PCT/KR2021/010893, filed Aug. 17, 2021, which claims the benefit under 35 U.S.C. § 119 of Korean Application Nos. 10-2020-0112121, filed Sep. 3, 2020; 10-2020-0155478, filed Nov. 19, 2020; the disclosures of each of which are incorporated herein by reference in their entirety.

TECHNICAL FIELD

An embodiment relates to a light path control member, and to a display device including the same.

BACKGROUND ART

A light blocking film blocks transmitting of light from a light source, and is attached to a front surface of a display panel which is a display device used for a mobile phone, a notebook, a tablet PC, a vehicle navigation device, a vehicle touch, etc., so that the light blocking film adjusts a viewing angle of light according to an incident angle of light to express a clear image quality at a viewing angle needed by a user when the display transmits a screen.

In addition, the light blocking film may be used for the window of a vehicle, building or the like to shield outside light partially to inhibit glare, or to inhibit the inside from being visible from the outside.

That is, the light blocking film may be a light path control member that controls the movement path of light to block light in a specific direction and transmit light in a specific direction. Accordingly, it is possible to control the viewing angle of the user by controlling a transmission angle of the light by the light blocking film.

Meanwhile, such a light blocking film may be divided into a light blocking film that can always control the viewing angle regardless of the surrounding environment or the user's environment and a switchable light blocking film that allow the user to turn on/off the viewing angle control according to the surrounding environment or the user's environment.

Such a switchable light blocking film may be implemented by converting a accommodating portion into a light transmitting part and a light blocking part by filling the inside of the accommodating portion with light conversion material including particles that may move when a voltage is applied and a dispersion liquid for dispersing the particles and by dispersing and aggregating the particles.

The light conversion material may be injected from the injection part to the exit part through a capillary method by using one end of the accommodating part as an injection part and the other end as an exit part. Subsequently, the injection part and the exit part may be sealed with a sealing part, so that the light conversion material may be sealed inside the accommodating portion.

However, it is difficult to inject the light conversion material into the plurality of accommodating portions at a uniform speed, the characteristics of the light conversion material may be reduced due to the increase in the contact area between the light conversion material and the sealing material, and when the sealing part is delaminated, the light conversion material may leak out. Accordingly, reliability and driving characteristics of the light path control member may be reduced.

Accordingly, the light path control member having a new structure capable of solving the above problems is required.

DISCLOSURE

Technical Problem

An embodiment relates to a light path control member that can be easily manufactured and has improved reliability.

Technical Solution

A light path control member according to an embodiment includes: a first substrate; a first electrode disposed on the first substrate; a second substrate disposed on the first substrate; a second electrode disposed under the second substrate; a light conversion unit disposed between the first electrode and the second electrode; an adhesive layer between the second electrode and the light conversion unit; and a buffer layer between the first electrode and the light conversion unit, the light conversion unit includes a plurality of partition wall portions, a plurality of accommodating portions, and a base portion, a light conversion material is disposed in the accommodating portion, at least two sealing regions formed on at least one of the first substrate and the second substrate, the accommodating portion extends in a second direction and is disposed, a moving part connected to the accommodating portion and extending in a first direction different from the second direction, the moving part is connected to the sealing region and the accommodating portion, the sealing region is formed through the first substrate, the first electrode and the buffer layer or through the second substrate, the second electrode and the adhesive layer, the sealing region overlaps the moving part.

Advantageous Effects

The light path control member according to the embodiment may fill the accommodating portion with a light conversion material by the first sealing region, a second sealing region, a first moving part, and a second moving part.

Accordingly, since the light conversion material is filled in the plurality of accommodating portions at a uniform speed by the first moving part and the second moving part, process efficiency may be improved, and deviation of the light conversion material filled in the plurality of accommodating portions may be reduced.

In addition, since the light conversion material is injected by the first sealing region and the second sealing region, when the light conversion material is injected into the accommodating portion, overflow of the light conversion material may be easily confirmed. Accordingly, the loss of the light conversion material may be minimized, and contamination of the surface of the light path control member by the overflow of the light conversion material may be inhibited.

In addition, since the light conversion material may be sealed by disposing the first sealing part and the second sealing part in the first sealing region and the second sealing region, respectively, the use of a sealing material for sealing the light conversion material may be minimized.

In addition, since the sizes of the first sealing region and the second sealing region are smaller than the sizes of the first moving part and the second moving part, and the sizes of the first moving part and the second moving part are smaller than a bezel area, an area of the light path control region may be increased.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a light path control member according to an embodiment will be described with reference to drawings.

Figure 1:
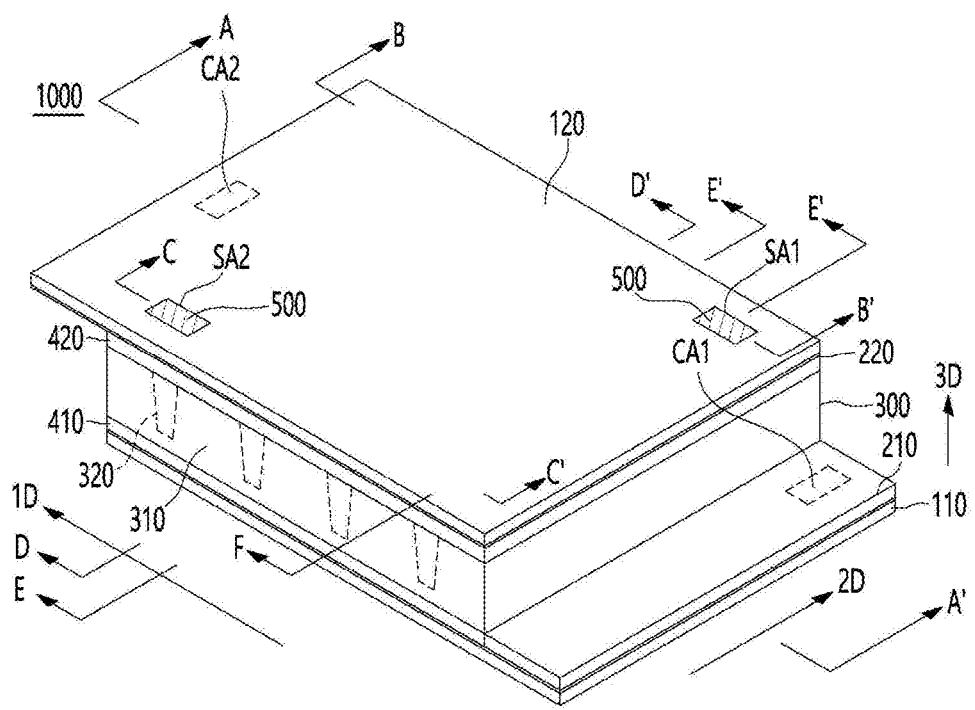
FIG. 1 is a perspective view of a light path control member according to a first embodiment.

FIG. 1 is a perspective view of a light path control member according to a first embodiment.

Referring to FIG. 1, the light path control member 1000 according to the first embodiment may include a first substrate 110, a second substrate 120, a first electrode 210, a second electrode 220, a light conversion unit 300, and a sealing part 500.

The light conversion unit 300 may be disposed between the first substrate 110 and the second substrate 120. In detail, the light conversion unit 300 may be disposed between the first electrode 210 and the second electrode 220.

A buffer layer 410 may be disposed between the light conversion unit 300 and the first electrode 210. The buffer layer 410 may improve adhesion between the first electrode 210 and the light conversion unit 300, which are made of different materials.

An adhesive layer 420 may be disposed between the light conversion unit 300 and the second electrode 220. The light conversion unit 300 and the second electrode 220 may be bonded by the adhesive layer 420.

The buffer layer 410 and the adhesive layer 420 may include a transparent material capable of transmitting light. For example. the adhesive layer 420 may include an optically transparent adhesive.

The light path control member 1000 may extend in a first direction 1D, a second direction 2D, and a third direction 3D.

In detail, the light path control member 1000 may include the first direction 1D corresponding to the length or width direction of the light path control member 1000, the second direction 2D extending in a direction different from the first direction and corresponding to the length or width direction of the light path control member 1000, and the third direction 3D extending in a direction different from the first and second directions and corresponding to the thickness direction of the light path control member 1000.

For example, the first direction 1D may be defined as the length direction of the light path control member 1000, the second direction 2D may be defined as the width direction perpendicular to the first direction 1D, and the third direction 3D may be defined as the thickness direction of the light path control member 1000. Alternatively, the first direction 1D may be defined as the width direction of the light path control member 1000, the second direction 2D may be defined as the length direction perpendicular to the first direction 1D, and the third direction 3D may be defined as the thickness direction of the light path control member 1000.

Hereinafter, for convenience of description, the first direction 1D is described as the length direction of the light path control member 1000, the second direction 2D is described as the width direction of the light path control member 1000, and the third direction 3D is described as the thickness direction of the light path control member 1000.

Figure 2:
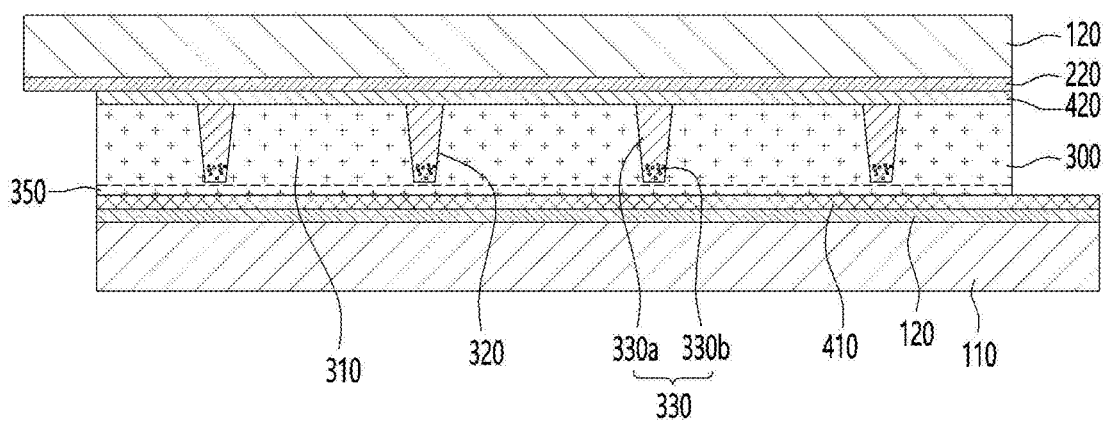
FIGS. 2 and 3 are cross-sectional views taken along area A-A' of FIG. 1.
Figure 3:
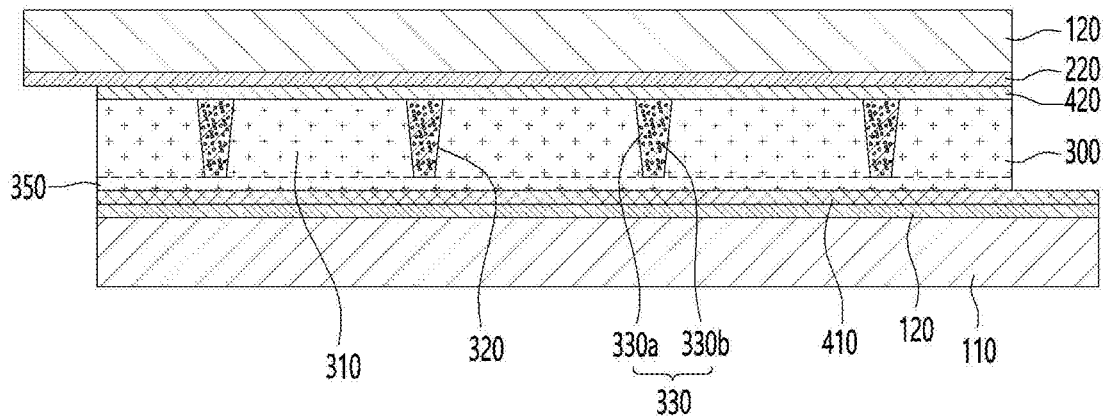

FIGS. 2 and 3 are cross-sectional views taken along area A-A' of FIG. 1.

Referring to FIGS. 2 and 3, the light conversion unit 300 may include a plurality of partition wall portions 310, a plurality of accommodating portions 320, and a base portion 350.

Each of the partition wall portion 310 and the accommodating portion 320 may include a plurality of numbers, and the partition wall portion 310 and the accommodating portion 320 may be alternately disposed. That is, one accommodating portion 320 may be disposed between two adjacent partition wall portions, and one partition wall portion 310 may be disposed between the two adjacent accommodating portions.

The base portion 350 may be disposed below the accommodating portion 320. In detail, the base portion 350 may be disposed between the accommodating portion 320 and the buffer layer 410. Accordingly, the light conversion unit 300 may be adhered to the first electrode 210 by the base portion 350 and the buffer layer 410.

In addition, the adhesive layer 420 may be disposed between the partition wall portion 310 and the second electrode 220, and the light conversion unit 300 and the second electrode 220 may be bonded by the adhesive layer 420.

The base portion 350 is a region formed while performing an imprinting process for forming the partition wall portion 310 and the accommodating portion 320 in a resin layer constituting the partition wall portion 310 and the accommodating portion 320, and the base portion 350 may include the same material as the partition wall portion 310. That is, the base portion 350 and the partition wall portion 310 may be integrally formed.

The partition wall portion 310 may transmit light. In addition, a light transmittance of the accommodating portion 320 may be changed according to the application of voltage.

In detail, a light conversion material 330 may be disposed in the accommodating portion 320. The light transmittance of the accommodating portion 320 may be varied by the light conversion material 330. The light conversion material 330 may include light conversion particles 330*b* that move when a voltage is applied and a dispersion liquid 330*a* that disperses the light conversion particles 330*b*. In addition, the light conversion material 330 may further include a dispersing agent that inhibits aggregation of the light conversion particles 330*b*.

According to the application of the voltage, the light conversion particles 330*b* inside the dispersion liquid 330*a* may move. For example, referring to FIG. 2, surfaces of the light conversion particles 330*b* inside the dispersion liquid 330*a* are negatively charged, and when a positive voltage is applied from the first electrode 210 and the second electrode 220, the light conversion particles 330*b* are moved in the direction of the first electrode 210 or the second electrode 220, and thereby the accommodating portion 320 may become a light transmitting part.

Also, referring to FIG. 3, when a negative voltage is applied from the first electrode 210 and the second electrode 220, the light conversion particles 330*b* are dispersed again inside the dispersion liquid 330*a*, and thereby the accommodating portion 320 may become a light blocking part.

Figure 4:
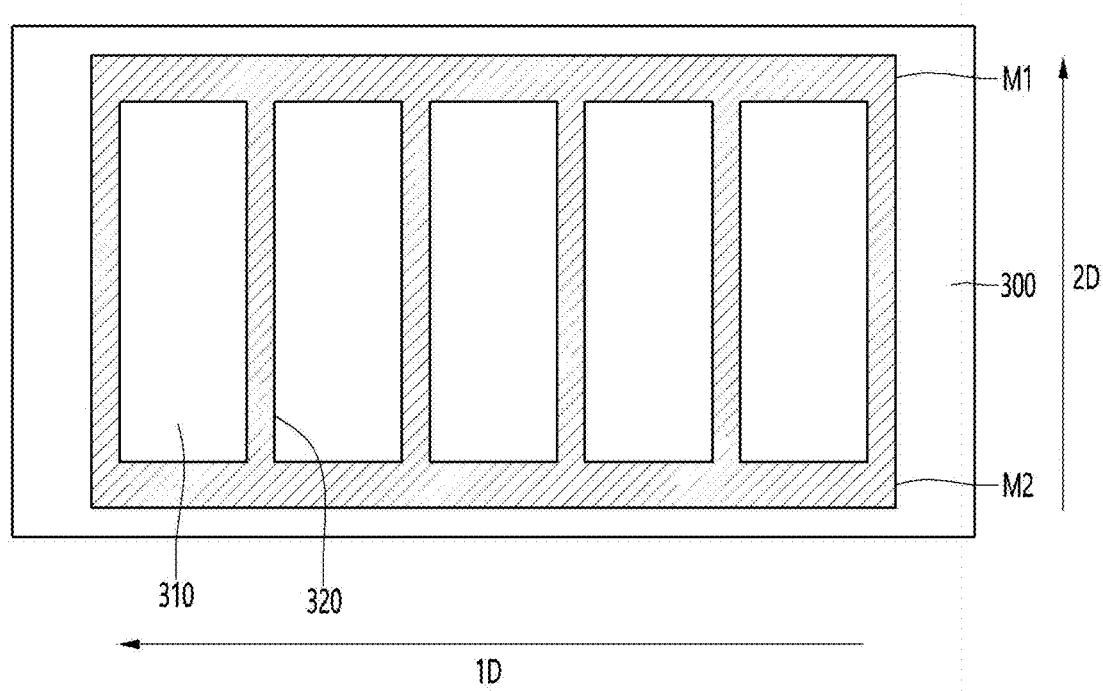
FIG. 4 is a plan view of the light conversion unit of the light path control member according to the first embodiment.

FIG. 4 is a plan view of the light conversion unit of the light path control member according to the first embodiment.

Referring to FIG. 4, the partition wall portion 310 and the accommodating portion 320 may extend in the same direction. In detail, the accommodating portion 320 may extend in the second direction 2D. That is, the accommodating portion 320 may extend in a second direction 2D perpendicular to the first direction 1D, which is the longitudinal direction of the light path control member 1000.

The light conversion material 330 disposed inside the accommodating portion 320 may be sealed by a sealing part formed of a sealing material to inhibit leakage of the light conversion material 330 or permeation of external impurities.

At this time, when the area of the sealing part is large, adhesion failure of the sealing part may occur. Also, when the contact area between the sealing part and the light conversion material is increased, the light conversion material and the sealing part react in the contact area, and thus the characteristics of the light conversion material may be reduced. In addition, a bezel area in which light is not converted by the sealing part may be increased.

The light path control member according to the embodiment solves the above problems.

Figure 5:
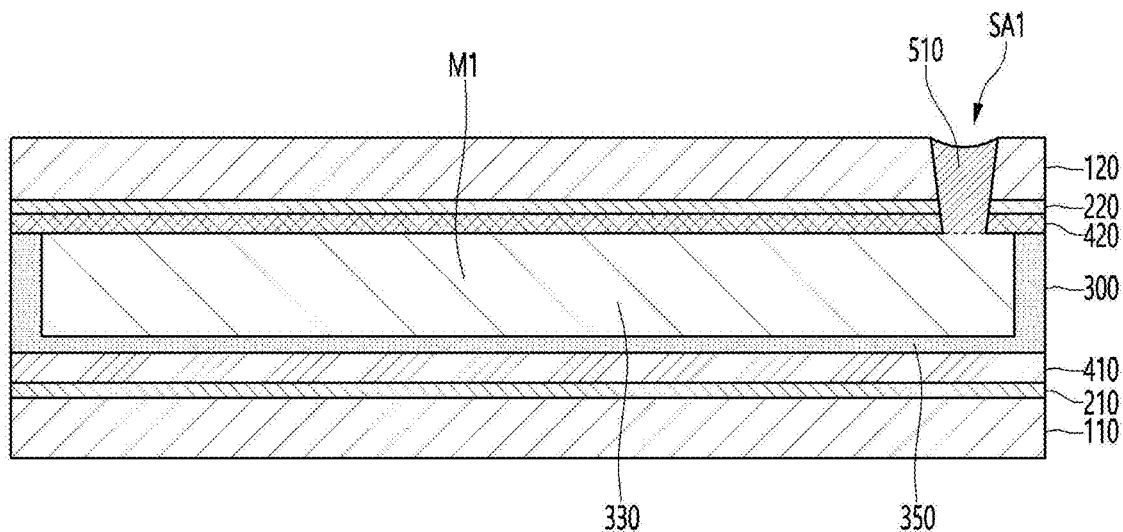
FIG. 5 is a cross-sectional view taken along area B-B' of FIG. 1.
Figure 6:
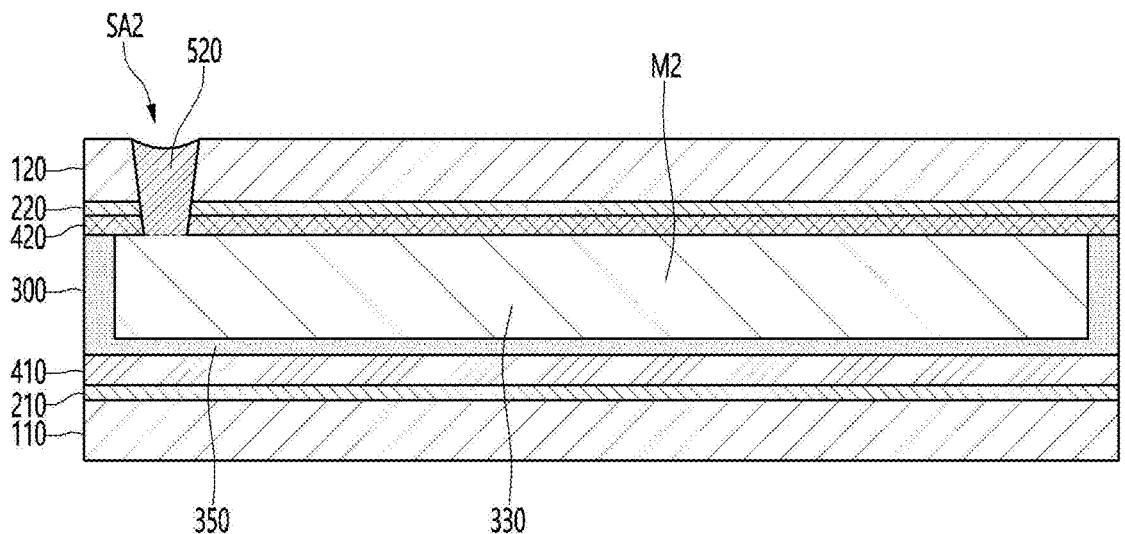
FIG. 6 is a cross-sectional view taken along area C-C' of FIG. 1.

FIG. 5 is a cross-sectional view taken along area B-B' of FIG. 1, and FIG. 6 is a cross-sectional view taken along area C-C' of FIG. 1.

Referring to FIGS. 1, 5, and 6, the light path control member 1000 may include a plurality of holes. In detail, the light path control member 1000 may include a plurality of holes formed in the second substrate 120. Although FIG. 1 shows only two holes formed on the second substrate 120, the embodiment is not limited thereto, and three or more holes may be formed on the second substrate 120.

Hereinafter, for convenience of explanation, it will be described that two holes are formed in the second substrate.

The hole formed on the second substrate 120 may be a sealing region. In detail, the light path control member 1000 may include a first sealing region SA1 and a second sealing region SA2.

The first sealing region SA1 and the second sealing region SA2 may face each other. For example, the first sealing region SA1 may be disposed at one end of the accommodating portion 320, and the second sealing region SA2 may be disposed at the other end of the accommodating portion 320.

The first sealing region SA1 and the second sealing region SA2 may face each other in the second direction 2D or may face each other in diagonal directions of the first and second directions.

Referring to FIGS. 5 and 6, the first sealing region SA1 and the second sealing region SA2 may be formed through the second substrate 120, the second electrode 220, and the adhesive layer 420. That is, the first sealing region SA1 and the second sealing region SA2 penetrate one area of the second substrate 120, the second electrode 220, and the adhesive layer 420, and may expose side surfaces of the second substrate 120, the second electrode 220, and the adhesive layer 420.

The first sealing region SA1 and the second sealing region SA2 may be an injection part and a exit part for injecting a light conversion material 330 into the accommodating portion 320. That is, one sealing region of the first sealing region SA1 and the second sealing region SA2 may be an injection part, and the other sealing region may be an exit part.

After all of the light conversion material 330 is injected into the accommodating portion 320, sealing parts for sealing the light conversion material 330 may be disposed in the first sealing region SA1 and the second sealing region SA2. That is, a first sealing part 510 and a second sealing part 520 may be disposed in the first sealing region SA1 and the second sealing region SA2, respectively.

In addition, a first moving part M1 and a second moving part M2 may be formed below the first sealing region SA1 and the second sealing region SA2, respectively.

The first moving part M1 and the second moving part M2 may be respectively disposed at both ends of the accommodating portion 320. In detail, the first moving part M1 may be disposed at one end or the other end of the accommodating portion 320, and the second moving part M2 may be disposed at one end or the other end of the accommodating portion 320. Accordingly, the first moving part M1 and the second moving part M2 may face each other in the second direction 2D.

Also, the first moving part M1 and the second moving part M2 may extend in directions different from those of the accommodating portion 320. For example, the first moving part M1 and the second moving part M2 may extend in the first direction 1D. For example, the first moving part M1 and the second moving part M2 may extend in a direction perpendicular to the extending direction of the accommodating portion 320.

The first moving part M1 and the second moving part M2 may be disposed at positions overlapping the first sealing region SA1 and the second sealing region SA2 in a third direction, respectively. That is, the first sealing region SA1 may be disposed at one end of the first moving part M1 and overlap the first moving part M1 in the third direction 3D. In addition, the second sealing region SA2 may be disposed at one end of the second moving part M2 and overlap the second moving part M2t in the third direction 3D.

The first moving part M1 and the second moving part M2 may be formed by removing the partition wall portion 310. In detail, the first moving part M1 and the second moving part M2 may be formed by removing part or all of the partition wall portion 310. Alternatively, the first moving part M1 and the second moving part M2 may be formed by removing the entirety of the partition wall portion 310 and removing part or all of the base portion 350.

Accordingly, the depths of the first moving part M1 and the second moving part M2 may be the same as or similar to a depth of the accommodating portion 320. In detail, when the first moving part M1 and the second moving part M2 are formed by removing the entirety of the partition wall portion 310, the depths of the first moving part M1 and the second moving part M2 may be the same as the depth of the accommodating portion 320. Alternatively, when the first moving part M1 and the second moving part M2 are formed by removing a part of the partition wall portion 310, the depths of the first moving part M1 and the second moving part M2 may be smaller than the depth of the accommodating portion 320. Alternatively, when the first moving part M1 and the second moving part M2 are formed by removing the entirety of the partition wall portion 310 and all or part of the base portion, the depths of the first moving part M1 and the second moving part M2 may be greater than the depth of the accommodating portion 320.

For example, the depth of the first moving part M1 and the second moving part M2 may be 80% to 120% of the depth of the accommodating portion 320.

The first moving part M1 and the second moving part M2 may be regions in which the light conversion material 330 moves. In detail, the first moving part M1 may be connected to the first sealing region SA1 and the accommodating portion 320, and the second moving part M2 may be connected to the second sealing region SA2 and the accommodating portion 320.

For example, when the first sealing region SA1 is defined as an injection part and the second sealing region SA2 is defined as an exit part, the light conversion material 330 is injected into the first sealing region SA1. Subsequently, the light conversion material 330 is injected into one end and the other end of the plurality of accommodating portions 320 from the second sealing region SA2 through the first moving region MA1 by a capillary method of vacuuming the light conversion material 330, and thereby the light conversion material 330 may be filled inside the accommodating portion 320.

Meanwhile, widths of the first moving part M1 and the second moving part M2 may be greater than the width of the accommodating portion 320. In detail, widths of the first moving part M1 and the second moving part M2 in the second direction may be greater than width of the accommodating portion 320 in the first direction. Accordingly, since the widths of the first moving part M1 and the second moving part M2 are large, the light conversion material 330 may be easily moved by the first moving part M1 and the second moving part M2.

Subsequently, the sealing part 500 may be formed by filling the first sealing region SA1 and the second sealing region SA2 with a sealing material.

In detail, after removing the light conversion material 300 of the first sealing region SA1 and the second sealing region SA2, the sealing material may be filled in the first sealing region SA1 and the second sealing region SA2.

For example, after blocking the first sealing region SA1 on the injection part side so that the light conversion material 330 inside the accommodating portion 320, the first moving part M1, and the second moving part M2 do not move, the second sealing region SA2 on the exit part side may be cleaned, and after blocking the second sealing region SA2 on the exit part side, the first sealing region SA1 on the injection part side may be cleaned, and thereby the light conversion material 330 remaining inside the first sealing region SA1 and the second sealing region SA2 may be removed.

Accordingly, a space filled with a sealing material may be formed in the first sealing region SA1 and the second sealing region SA2, and the sealing material may fill the first sealing region SA1 and the second sealing region SA2.

Accordingly, the first sealing part 510 may be disposed in the first sealing region SA1, and a second sealing part 520 may be disposed in the second sealing region SA2.

A portion of the sealing material disposed in the first sealing region SA1 and the second sealing region SA2 may flow into the first moving part M1 and the second moving part M2 during a process.

Accordingly, only the light conversion material or both the light conversion material and the sealing material may be disposed in the first moving part M1 and the second moving part M2.

Figure 7:
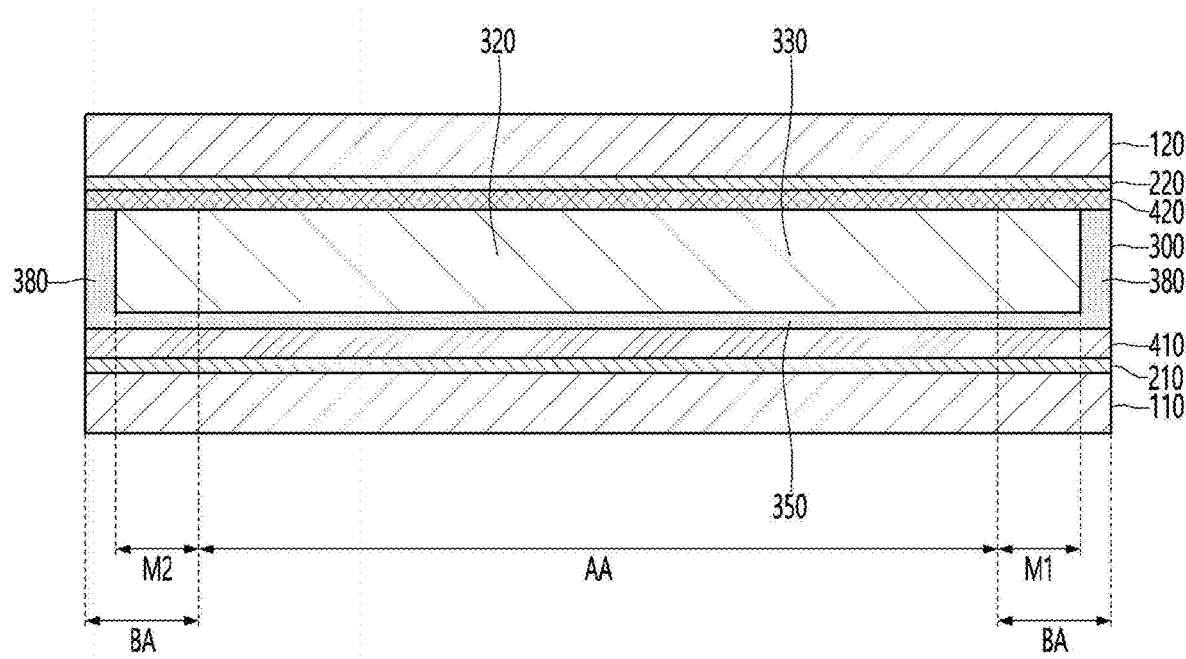
FIG. 7 is a cross-sectional view taken along area D-D' of FIG. 1.
Figure 8:
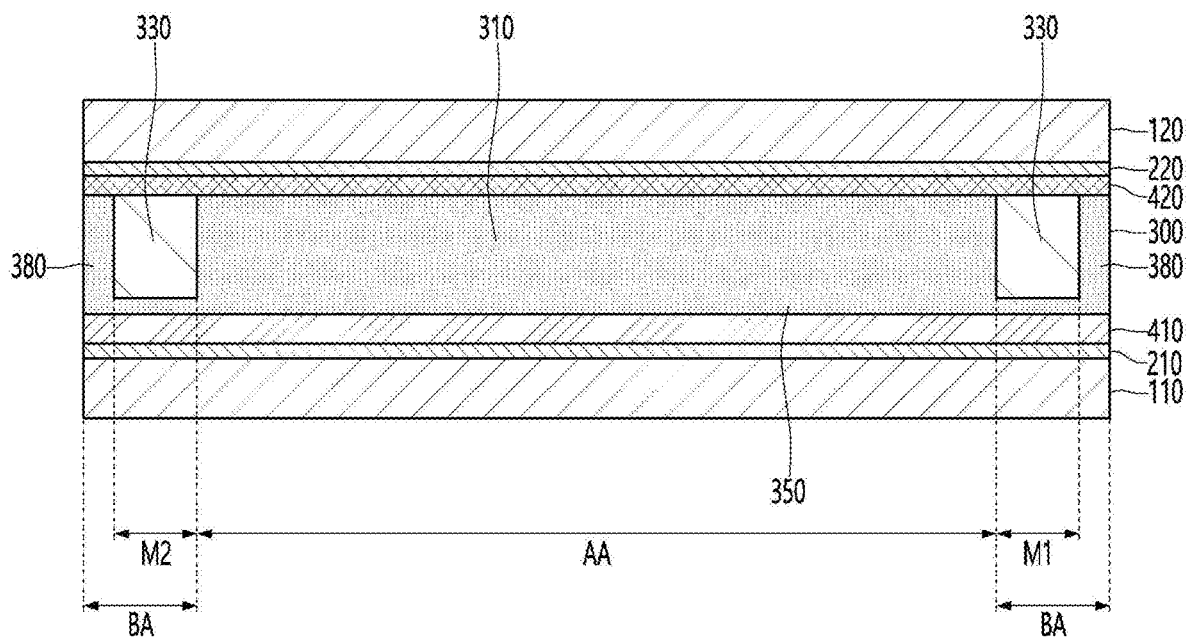
FIG. 8 is a cross-sectional view taken along area E-E' of FIG. 1.

FIG. 7 is a cross-sectional view of an area D-D' of FIG. 1, in which one of a plurality of accommodation portions is cut in a second direction. In addition, FIG. 8 is a cross-sectional view of an area E-E' of FIG. 1, in which one of a plurality of partition wall portions is cut in a second direction.

Referring to FIG. 7, the light conversion material 330 may be disposed on the first moving part M1, the second moving part M2, and the accommodating portion 320.

The light conversion materials 330 disposed in the first moving part M1, the second moving part M2, and the accommodating portion 320 may be integrally formed. That is, the light conversion material 330 of the first moving part M1 and the second moving part M2 extending in the first direction 1D and the light conversion material 330 of the accommodating portion 320 extending in the second direction 2D may be integrally formed by being connected to each other.

The light conversion material 330 of the first moving part M1 and the second moving part M2 may be disposed in contact with the side surface portion 380. The side surface portion 380 may be an embossed area remaining after forming the partition wall portion 310, the accommodating portion 320, the base portion 350, the first moving part M1, and the second moving part M2 in the resin layer forming the light conversion unit 300. The side surface portion 380 may be disposed outside the first moving part M1 and the second moving part M2. Accordingly, the first moving part M1 and the second moving part M2 may be disposed between the side surface portion 380 and the partition wall portion 310 and between the side surface portion 380 and the accommodating portion 320.

Accordingly, the side surface portion 380 may include the same material as the partition wall portion 310 and the base portion 350. In addition, the height of the side surface portion 380 may be the same as or similar to the height of the partition wall portion 310.

The side surface portion 380 may be disposed while extending in the second direction 2D and contacting the first moving part M1 and the second moving part M2.

Accordingly, when the light conversion material 330 is disposed inside the accommodating portion 320 through the first moving part M1 and the second moving part M2, overflowing of the light conversion material 330 to the outside of the light path control member 1000 may be inhibited by the side surface portion 380. In addition, since the side surface portion 380 is disposed while contacting the light conversion material 330 of the first moving part M1 and the second moving part M2, the light conversion material 330 of the first moving part M1 and the second moving part M2 may be sealed.

The light path control member 1000 may be divided into an effective area AA and a bezel area BA by the accommodating portion 320, the first moving part M1, the second moving part M2 and the side surface portion 380.

In detail, the light conversion unit 330 of the light path control member 1000 may be defined as the effective area where the accommodating portion 320 is disposed, and the bezel area where the first moving part M1, the second moving part M2, and the side surface portion 380 are disposed.

That is, the first moving part M1 and one side surface portion may be disposed on one side of the light path control member 1000, and the second moving part M2 and the other surface portion facing the one surface portion may be disposed on the other side.

A width of the first moving part M1 in the second direction 2D may be different from a width of the side surface portion 380 in the second direction 2D. Also, a width of the second moving part M2 in the second direction 2D may be different from a width of the side surface portion 380 in the second direction 2D.

In detail, the maximum width of the first moving part M1 may be greater than the maximum width of the side surface portion 380, and the maximum width of the second moving part M2 may be greater than the maximum width of the surface portion 380.

A width of the effective area AA in the second direction 2D may be greater than a width of the bezel area BA in the second direction 2D, and the width of the bezel area BA in the second direction 2D may be greater than a width of the first moving part M1 in the first direction 1D and a width of the second moving part M2 in the first direction 1D.

Referring to FIG. 8, the light conversion material 330 may be disposed on the first moving part M1 and the second moving part M2.

That is, the light conversion materials 330 may also be disposed at both ends in the second direction 2D corresponding to the partition wall portion 310.

That is, the light conversion materials 330 of the first moving part M1 and the second moving part M2 may be disposed to contact both ends of the partition wall portion 310.

Accordingly, the light conversion material 330 may be disposed not only in the effective area AA but also in the bezel area BA. In detail, the light conversion material 330 disposed in the first moving part M1 and the second moving part M2 extending in a direction different from that of the accommodating portion 320 may be disposed in the bezel area BA.

Accordingly, the light path control member according to the first embodiment may control the path of light not only in the effective area but also in the bezel area. In addition, since the light conversion material disposed in the bezel area extends in a different direction from the light conversion material disposed in the accommodating portion, the light path control member according to the embodiment may control both left and right and up and down light paths.

Figure 9:
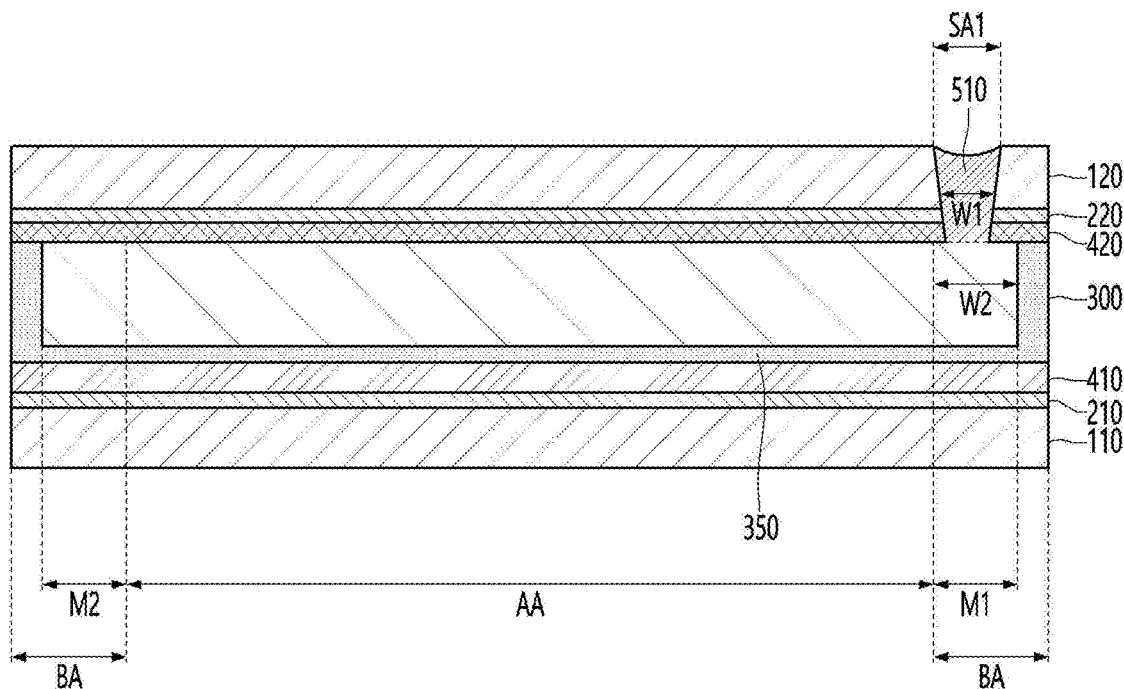
FIG. 9 is a cross-sectional view taken along area F-F' of FIG. 1.

FIG. 9 is a cross-sectional view taken along area F-F' of FIG. 1.

Referring to FIG. 9, a width of the first sealing region SA1 in the second direction 2D may be different from a width of the first moving part M1 in the second direction 2D and a width of the second moving part M2 in the second direction 2D. In detail, the width w1 of the first sealing region SA1 in the second direction 2D may be smaller than the width w2 of the first moving part M1 in the second direction 2D and the width w2 of the second moving part M2 in the second direction 2D.

Also, although not shown in the drawing, a width of the second sealing region SA2 in the second direction 2D may be different from a width of the first moving part M1 in the second direction 2D and a width of the second moving part M2 in the second direction 2D. In detail, the width of the second sealing region SA2 in the second direction 2D may be smaller than the width w2 of the first moving part M1 in the second direction 2D and the width w2 of the second moving part M2 in the second direction 2D.

Here, the width of the first sealing region SA1 in the second direction 2D may be defined as the maximum width of the first sealing region SA1, and the width of the second sealing region SA2 in the second direction 2D may be defined as the maximum width of the second sealing region SA2.

That is, widths of the first sealing region SA1 and the second sealing region SA2 where the sealing part 500 is disposed may be smaller than widths of the first moving part M1 and the second moving part M2 where the light conversion material 300 is disposed.

Accordingly, in the first sealing region SA1, the second sealing region SA2, the first moving part M1, and the second moving part M2 disposed in the bezel area BA, a size of the light conversion material that controls the path of light is increased, and a size of the sealing part that cannot control the path of light is relatively small, and thereby a light path control area may be widened in the bezel area.

The light path control member according to the embodiment may fill the accommodating portion with the light conversion material by the first sealing region, a second sealing region, a first moving part, and a second moving part.

Accordingly, since the light conversion material is filled in the plurality of accommodating portions at a uniform speed by the first moving part and the second moving part, process efficiency may be improved, and deviation of the light conversion material filled in the plurality of accommodating portions may be reduced.

In addition, since the light conversion material is injected by the first sealing region and the second sealing region, when the light conversion material is injected into the accommodating portion, overflow of the light conversion material may be easily confirmed. Accordingly, the loss of the light conversion material may be minimized, and contamination of the surface of the light path control member by the overflow of the light conversion material may be inhibited.

In addition, since the light conversion material may be sealed by disposing the first sealing part and the second sealing part in the first sealing region and the second sealing region, respectively, the use of the sealing material for sealing the light conversion material may be minimized.

In addition, since the sizes of the first sealing region and the second sealing region are smaller than the sizes of the first moving part and the second moving part, and the sizes of the first moving part and the second moving part are smaller than the bezel area, an area of the light path control region may be increased Meanwhile, the accommodating portion 320 of the light conversion unit 300 described above may extend while having an inclination with respect to the first moving part M1 and the second moving part M2.

Figure 10:
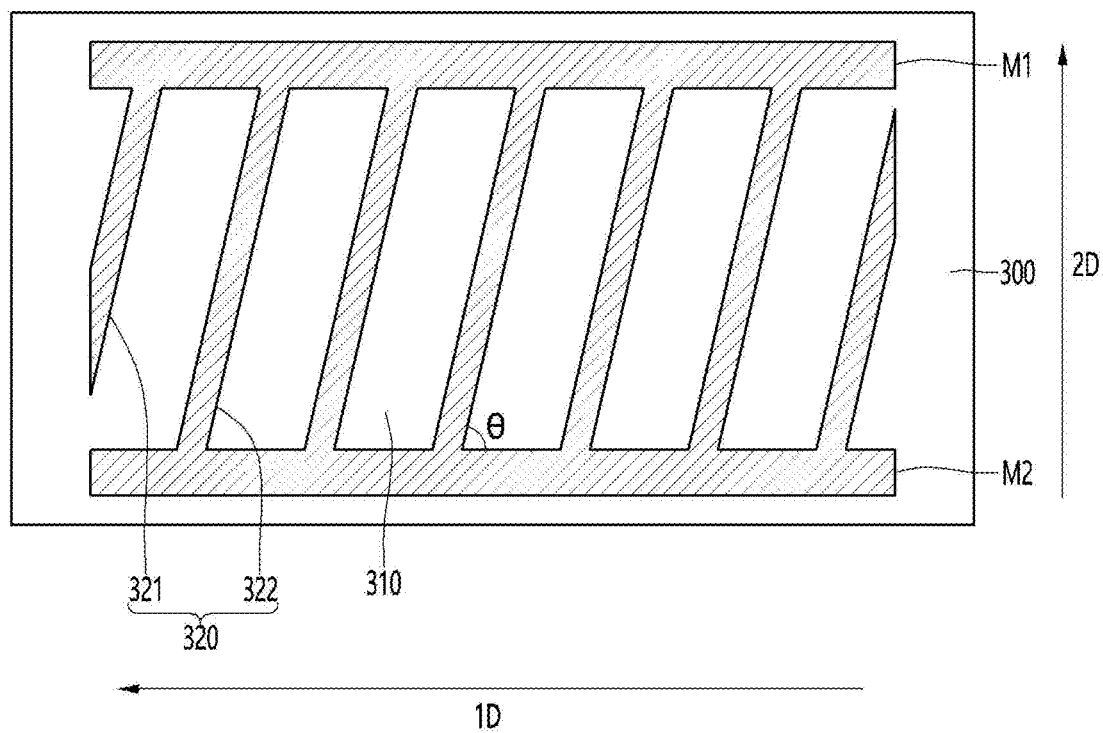
FIG. 10 is another plan view of the light conversion unit of the light path control member according to the embodiment.

FIG. 10 is another plan view of the light conversion unit of the light path control member according to the first embodiment.

Referring to FIG. 10, the accommodating portion 320 may extend in a second direction 2D. In detail, the accommodating portion 320 may extend in the second direction 2D while having an acute angle θ of inclination with respect to the first direction 1D in which the first moving part M1 and the second moving part M2 extend.

Since the extension direction of the accommodating portion is inclined at a predetermined angle range with respect to the moving part, when the light path control member is applied to the display device, a moiré phenomenon due to overlapping of the accommodating part pattern and the pattern of another member may be inhibited.

In detail, when the light path control member is combined with a display panel and applied to a display device, since the accommodating portion is tilted in a certain angle range, the moiré phenomenon caused by overlapping the pattern of the display panel and the accommodating portion pattern may be reduced. Accordingly, the visibility of the display device may be improved.

Any one of a plurality of accommodating parts may contact only one of the first moving part M1 and the second moving part M2.

In detail, the plurality of accommodating portions may include a first accommodating portion 321 disposed at an outermost side and a second accommodating portion 322 disposed between the first accommodating portions 321.

The second accommodating portion 322 may contact both the first moving part M1 and the second moving part M2.

The first accommodating portion 321 may not contact any one accommodating portion of the first moving part M1 and the second moving part M2. That is, any one of the first accommodating portion 321 among the first accommodating portions 321 defined as the two outermost accommodating portions may contact only any one of the first moving part M1 and the second moving part M2.

That is, one end of one of the two first accommodating portions 321 may contact the first moving part M1, and the other end may not contact the second moving part M2. Also, one end of the other first accommodating portion 321 may not contact the first moving part M1, and the other end may contact the second moving part M2.

Accordingly, the inclination angle of the accommodating portion may be easily controlled according to the application environment of the light path control member regardless of whether the accommodating portion and the moving part contact each other.

In addition, since the outer area of the light path control member may be used, the size of the bezel of the display may be reduced.

Hereinafter, a light path control member according to a second embodiment will be described with reference to FIGS. 11 to 13. In the description of the light path control member according to the second embodiment, descriptions of identical or similar elements to those of the light path control member according to the above-described embodiment will be omitted, and the same reference numerals will be assigned to the same compositions.

Figure 11:
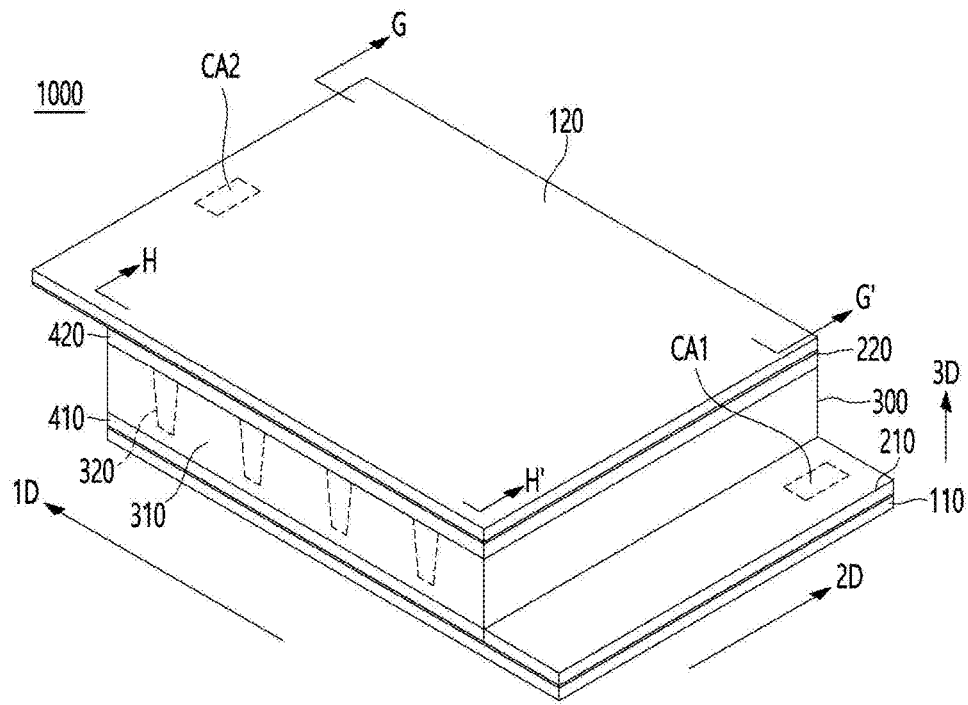
FIG. 11 is a perspective view of a light path control member according to a second embodiment.
Figure 12:
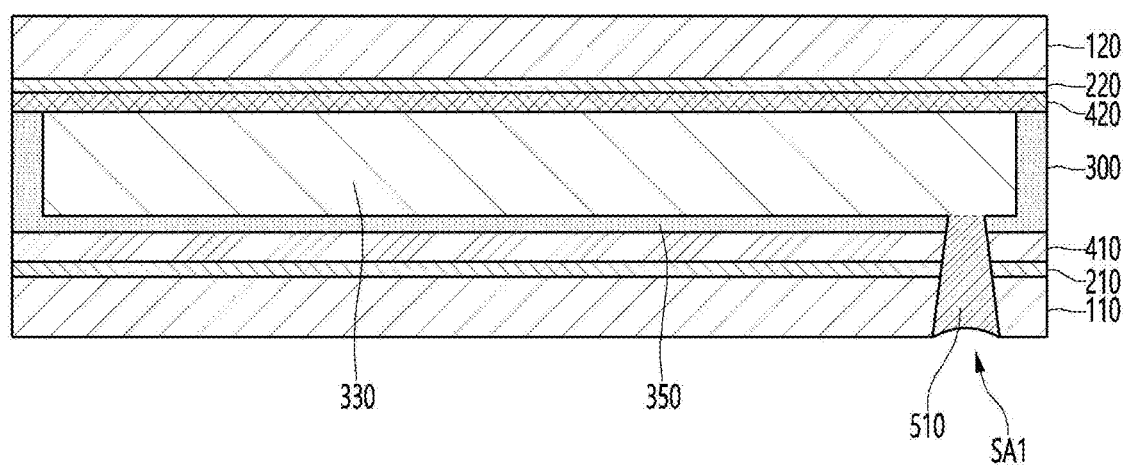
FIG. 12 is a cross-sectional view taken along area G-G' of FIG. 11.
Figure 13:
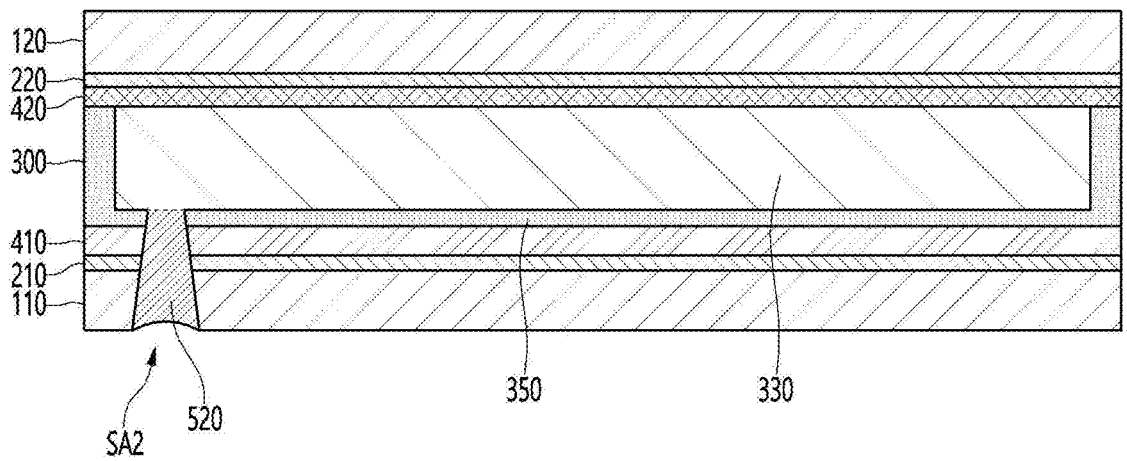
FIG. 13 is a cross-sectional view taken along area H-H' of FIG. 11.

Referring to FIGS. 11 to 13, the first sealing region SA1 and the second sealing region SA2 may be formed on the other surface of the light path control member described above. In detail, the first sealing region SA1 and the second sealing region SA2 may be formed through the first substrate 110, the first electrode 210 and the buffer layer 410.

For example, referring to FIGS. 12 and 13, when the first sealing region SA1 is defined as the injection part into which the light conversion material is injected, and the second sealing region SA2 is defined as the exit part that vacuum-sucks the light conversion material, the first sealing region SA1 and the second sealing region SA2 may be formed through the first substrate 110, the first electrode 210, the buffer layer 410, and the base portion 350.

The first sealing region SA1 and the second sealing region SA2 of the light path control member according to the second embodiment may be formed to penetrate in the direction of the first substrate 110 of the light path control member.

Accordingly, since the first sealing region SA1 and the second sealing region SA2 are disposed on opposite surfaces from which the user views the light path control member, when the user uses the display to which the light path control member is applied, the first sealing region SA1 and the second sealing region SA2 may be inhibited from being visually recognized.

Hereinafter, a light path control member according to a third embodiment will be described with reference to FIGS. 14 to 16. In the description of the light path control member according to the third embodiment, descriptions of identical or similar elements to those of the light path control member according to the above-described embodiment will be omitted, and the same reference numerals will be assigned to the same compositions.

Figure 14:
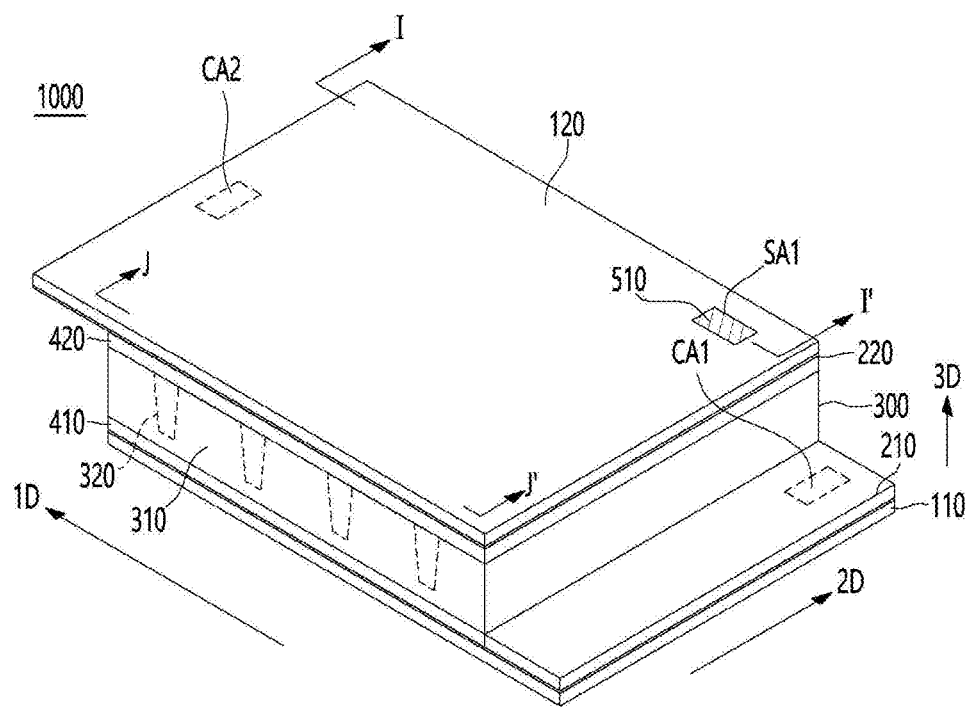
FIG. 14 is a perspective view of a light path control member according to a third embodiment.
Figure 15:
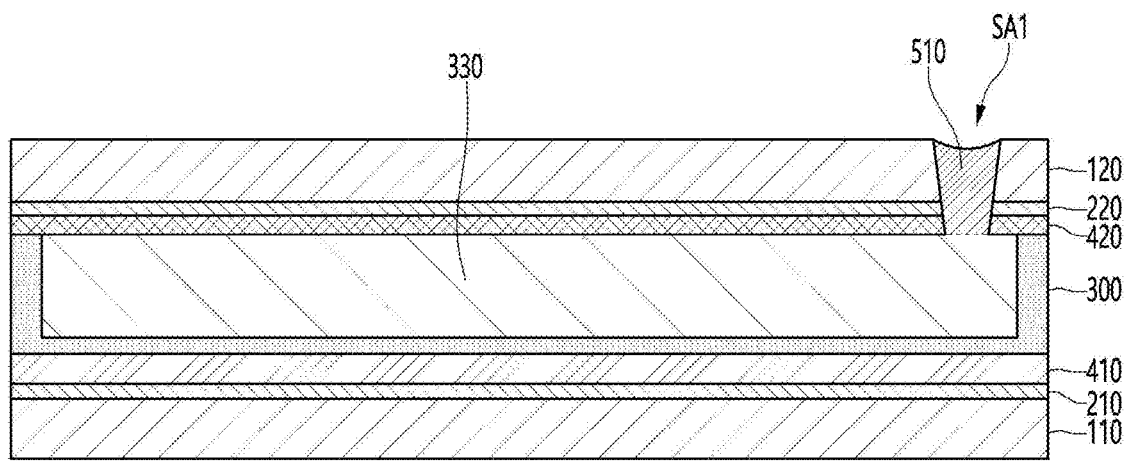
FIG. 15 is a cross-sectional view taken along area I-I' of FIG. 14.
Figure 16:
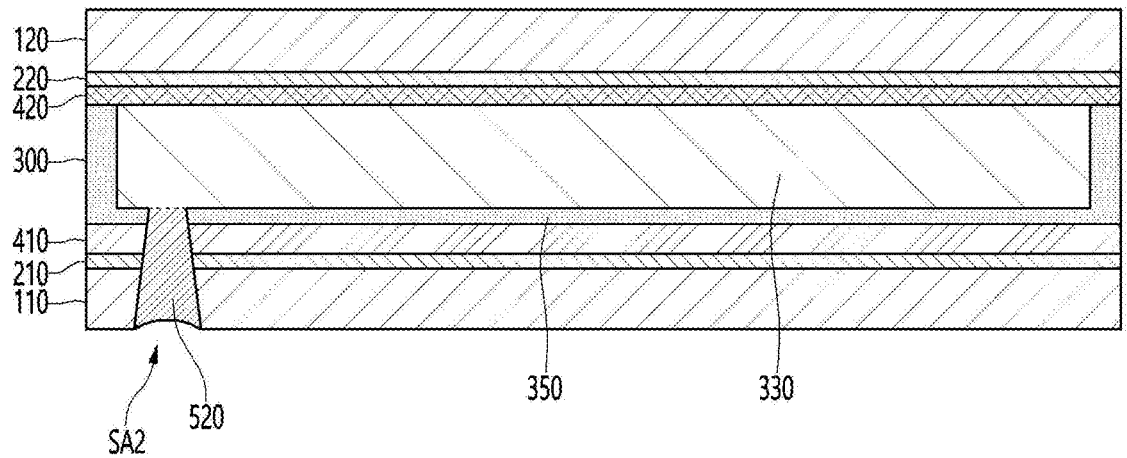
FIG. 16 is a cross-sectional view taken along area J-J' of FIG. 14.

Referring to FIGS. 14 to 16, the first sealing region SA1 and the second sealing region SA2 may be formed on different surfaces of the light path control member. In detail, one sealing region of the first sealing region SA1 and the second sealing region SA2 may be formed through the second substrate 120, the second electrode 210, and the adhesive layer 420, and the other sealing region may be formed through the first substrate 110, the first electrode 210, and the buffer layer 410.

For example, referring to FIGS. 15 and 16, when the first sealing region SA1 is defined as the injection part into which the light conversion material is injected, and the second sealing region SA2 is defined as the exit part that vacuum-sucks the light conversion material, the first sealing region SA1 may be formed through the second substrate 120, the second electrode 220, the adhesive layer 420, and the second sealing region SA2 may be formed through the first substrate 110, the first electrode 210, the buffer layer 410, and the base portion 350.

Accordingly, the first sealing part 510 and the second sealing part 500 disposed in the sealing areas may also be disposed on different surfaces of the light path control member.

That is, the first sealing part 510 may be disposed on an upper surface of the light path control member, and the second sealing part 520 may be disposed on a lower surface of the light path control member.

In the light path control member according to the third embodiment, the first sealing region SA1 and the second sealing region SA2 may be disposed on different surfaces of the light path control member. Also, the first sealing part 510 and the second sealing part 520 may be disposed on different surfaces of the light path control member.

Accordingly, the positions of the first sealing region and the second sealing region may be freely set. In addition, the first sealing region and the second sealing region may be disposed at a position where they entirely or partially overlap each other in the third direction. Accordingly, the light conversion material injection process efficiency may be improved by freely changing the positions of the first sealing region and the second sealing region according to various process environments in which the light conversion material is injected and sucked.

Hereinafter, other composition of the light path control member will be further described with reference to FIGS. 1 to 3.

The first substrate 110 may support the first electrode 210. The first substrate 110 may be rigid or flexible.

In addition, the first substrate 110 may be transparent. For example, the first substrate 110 may include a transparent substrate capable of transmitting light.

The first substrate 110 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example, but the embodiment is not limited thereto.

In addition, the first substrate 110 may be a flexible substrate having flexible characteristics.

Further, the first substrate 110 may be a curved or bended substrate. That is, the light path control member including the first substrate 110 may also be formed to have flexible, curved, or bent characteristics. Accordingly, the light path control member according to the embodiment may be changed to various designs.

The first electrode 210 may be disposed on one surface of the first substrate 110. In detail, the first electrode 210 may be disposed on an upper surface of the first substrate 110. That is, the first electrode 210 may be disposed between the first substrate 110 and the second substrate 120.

The first electrode 210 may include a transparent conductive material. For example, the first electrode 210 may include a conductive material having a light transmittance of about 80% or more. For example, the first electrode 210 may include a metal oxide such as indium tin oxide, indium zinc oxide, copper oxide, tin oxide, zinc oxide, titanium oxide, etc.

The first electrode 210 may have a thickness of 10 nm to 300 nm.

Alternatively, the first electrode 210 may include various metals to realize low resistance. For example, the first electrode 210 may include at least one metal of chromium (Cr), nickel (Ni), copper (Cu), aluminum (Al), silver (Ag), molybdenum (Mo). Gold (Au), titanium (Ti), and alloys thereof.

The first electrode 210 may be disposed on the entire surface of one surface of the first substrate 110. In detail, the first electrode 210 may be disposed as a surface electrode on one surface of the first substrate 110. However, the embodiment is not limited thereto, and the first electrode 210 may be formed of a plurality of pattern electrodes having a uniform pattern such as a mesh or stripe shape.

For example, the first electrode 210 may include a plurality of conductive patterns. In detail, the first electrode 210 may include a plurality of mesh lines crossing each other and a plurality of mesh openings formed by the mesh lines.

Accordingly, even though the first electrode 210 includes a metal, the first electrode 210 is not visually recognized from the outside, so that visibility may be improved. In addition, the light transmittance is increased by the openings, so that the brightness of the light path control member according to the embodiment may be improved.

The second substrate 120 may be disposed on the first substrate 110. In detail, the second substrate 120 may be disposed on the first electrode 210 on the first substrate 110.

The second substrate 120 may include a material capable of transmitting light. The second substrate 120 may include a transparent material. The second substrate 120 may include a material the same as or similar to that of the first substrate 110 described above.

The second electrode 220 may be disposed on one surface of the second substrate 120. In detail, the second electrode 220 may be disposed on a lower surface of the second substrate 120. That is, the second electrode 220 may be disposed on one surface of the second substrate 120 in which the second substrate 120 and the first substrate 110 face each other. That is, the second electrode 220 may be disposed to face the first electrode 210 on the first substrate 110. That is, the second electrode 220 may be disposed between the first electrode 210 and the second substrate 120.

The second electrode 220 may include a material the same as or similar to that of the first substrate 110 described above.

The first substrate 110 and the second substrate 120 may include protrusions. The first substrate 110 may include a first protrusion, and the second substrate 120 may include a second protrusion. In detail, the first substrate 110 and the second substrate 120 may each include a first protrusion and a second protrusion are disposed at positions misaligned from each other.

A connection region connected to an external printed circuit board or a flexible printed circuit board may be formed in the first protrusion of the first substrate 110 and the second protrusion of the second substrate 120, respectively.

In detail, a first connection region CA1 may be disposed on the first protrusion, and a second connection region CA2 may be disposed on the second protrusion. When the first protrusion and the second protrusion are disposed at positions misaligned from each other, the first connection region CA1 and the second connection region CA2 may be disposed so as not to overlap in the third direction 3A.

The first connection region CA1 and the second connection region CA2 may be disposed on the same plane. Alternatively, the first connection region CA1 and the second connection region CA2 may be disposed on different surfaces.

When the first connection region CA1 and the second connection region CA2 are disposed on the same plane, when connecting the first connection region CA1 and the second connection region CA2 to the printed circuit board or to the flexible printed circuit board, they may be connected on the same plane, and thus they may be easily connected.

A conductive material may be exposed on upper surfaces of the first connection region CA1 and the second connection region CA2, respectively. For example, the first electrode 210 may be exposed in the first connection region CA1 and the second electrode 220 may be exposed in the second connection region CA2. The light path control member may be electrically connected to the external printed circuit board or the flexible printed circuit board by the first connection region CA1 and the second connection region CA2.

For example, a pad portion may be disposed on the first connection region CA1 and the second connection region CA2, and a conductive adhesive including at least one of an anisotropic conductive film (ACF) and anisotropic conductive pastes (ACP) may be disposed between the pad portion and the printed circuit board or the flexible printed circuit board to connect the light path control member.

Alternatively, the conductive adhesive including at least one of an anisotropic conductive film (ACF) and anisotropic conductive pastes (ACP) may be disposed between the first connection region CA1 and the second connection region CA2 and the printed circuit board or the flexible printed circuit board to direct connect the light path control member without the pad portion.

The light conversion unit 300 may include the partition wall portion 310 and the accommodating portion 320.

The partition wall portion 310 may be defined as a partition wall region dividing the accommodating portion. That is, the partition wall portion 310 may transmit light as a partition wall region dividing a plurality of accommodation portions. That is, light emitted in the direction of the first substrate 110 or the second substrate 120 may pass through the partition wall portion.

The accommodating portion 320 may be formed to partially penetrate the light conversion unit 300. Accordingly, the accommodation portion 320 may be disposed in contact with the adhesive layer 420 and may be disposed to be spaced apart from the buffer layer 410. Accordingly, the base portion 350 may be formed between the accommodating portion 320 and the buffer layer 410.

The base portion 350 may be disposed on the partition wall portion 310. In detail, the base portion 350 may be disposed below the second electrode 220, and the partition wall portion 310 may be disposed below the base portion 350.

The partition wall portion 310 and base portion 350 may include a resin material. For example, the partition wall portion 310 and base portion 350 may include a photocurable resin material. As an example, the partition wall portion 310 and base portion 350 may include a UV resin or a transparent photoresist resin. Alternatively, the partition wall portion 310 and base portion 350 may include urethane resin or acrylic resin.

The partition wall portion 310 and the accommodating portion 320 may be disposed to extend in the second direction 2D of the first substrate 110 and the second substrate 120. That is, the partition wall portion 310 and the accommodating portion 320 may be disposed to extend in the width direction or the length direction of the first substrate 110 and the second substrate 120.

The partition wall portion 310 and the accommodating portion 320 may be disposed to have different widths. For example, a width of the partition wall portion 310 may be greater than that of the accommodating portion 320.

In addition, the accommodating portion 320 may be formed in a shape extending from the first electrode 210 toward the second electrode 220 and narrowing in width.

The partition wall portion 310 and the accommodating portion 320 may be alternately disposed with each other. In detail, the partition wall portion 310 and the accommodating portion 320 may be alternately disposed with each other. That is, each of the partition wall portions 310 may be disposed between the accommodating portions 320 adjacent to each other, and each of the accommodating portions 320 may be disposed between the partition wall portions 310 adjacent to each other.

The light conversion material 330 including light conversion particles 330b and the dispersion liquid 330a in which the light conversion particles 330b are dispersed may be disposed in the accommodation portion 320.

The dispersion liquid 330a may be a material for dispersing the light conversion particles 330b. The dispersion liquid 330a may include a transparent material. The dispersion liquid 330a may include a non-polar solvent. In addition, the dispersion liquid 330a may include a material capable of transmitting light.

The light conversion particles 330b may be disposed to be dispersed in the dispersion liquid 330a. In detail, the plurality of light conversion particles 330b may be disposed to be spaced apart from each other in the dispersion liquid 330a.

The light conversion particles 330b may include a material capable of absorbing light. That is, the light conversion particles 330b may be light absorbing particles. The light conversion particles 330b may have a color. For example, the light conversion particles 330b may have a black-based color. As an example, the light conversion particles 330b may include carbon black.

The light conversion particles 330b may have a polarity by charging a surface thereof. For example, the surface of the light conversion particles 330b may be charged with a negative (−) charge. Accordingly, according to the application of the voltage, the light conversion particles 330b may move toward the first electrode 210 or the second electrode 220.

The light transmittance of the accommodating portion 320 may be changed by the light conversion particles 330b. In detail, the accommodating portion 320 may be converted into the light blocking part and the light transmitting part by changing the light transmittance due to the movement of the light conversion particles 330b. That is, the accommodating portion 320 may change the transmittance of light passing through the accommodating portion 320 by dispersion and aggregation of the light conversion particles 330b disposed inside the dispersion liquid 330a.

For example, the light path control member according to the embodiment may be switched from a first mode to a second mode or from the second mode to the first mode by a voltage applied to the first electrode 210 and the second electrode 220.

In detail, in the light path control member according to the embodiment, the accommodating portion 320 becomes the light blocking part in the first mode, and light of a specific angle may be blocked by the accommodating portion 320. That is, a viewing angle of the user viewing from the outside is narrowed, so that the light path control member may be driven in a privacy mode.

In addition, in the light path control member according to the embodiment, the accommodating portion 320 becomes the light transmitting part in the second mode, and in the light path control member according to the embodiment, light may be transmitted through both the partition wall portion 310 and the accommodating portion 320. That is, the viewing angle of the user viewing from the outside may be widened, so that the light path control member may be driven in a public mode.

Switching from the first mode to the second mode, that is, the conversion of the accommodating portion 320 from the light blocking part to the light transmitting part may be realized by movement of the light conversion particles 330b of the accommodating portion 320. That is, the light conversion particles 330b may have a charge on the surface thereof and may move toward the first electrode or the second electrode according to the application of a voltage according to characteristics of the charge. That is, the light conversion particles 330b may be electrophoretic particles.

For example, when a voltage is not applied to the light path control member from the outside, the light conversion particles 330b of the accommodating portion 320 are uniformly dispersed in the dispersion liquid 330a, and the accommodating portion 320 may block light by the light conversion particles. Accordingly, in the first mode, the accommodating portion 320 may be driven as the light blocking part.

In addition, when a voltage is applied to the light path control member from the outside, the light conversion particles 330b may move. For example, the light conversion particles 330b may move toward one end or the other end of the accommodating portion 320 by a voltage transmitted through the first electrode 210 and the second electrode 220. That is, the light conversion particles 330b may move from the accommodating portion 320 toward the first electrode 210 or the second electrode 220.

For example, when a voltage is applied to the first electrode 210 and/or the second electrode 220, an electric field is formed between the first electrode 210 and the second electrode 220, and the light conversion particles 330b charged with the negative charge may move toward a positive electrode of the first electrode 210 and the second electrode 220 using the dispersion liquid 330a as a medium.

As an example, in the initial mode or when the voltage is not applied to the first electrode 210 and/or the second electrode 220, as shown in FIG. 3, the light conversion particles 330b may be uniformly dispersed in the dispersion liquid 330a, and the accommodating portion 320 may be driven as the light blocking part.

In addition, when the voltage is applied to the first electrode 210 and/or the second electrode 220, as shown in FIG. 2, the light conversion particles 330b may move toward the second electrode 220 in the dispersion liquid 330a. That is, the light conversion particles 330b move in one direction, and the accommodating portion 320 may be driven as the light transmitting part.

Accordingly, the light path control member according to the embodiment may be driven in two modes according to a user's surrounding environment. That is, when the user requires light transmission only at a specific viewing angle, the accommodating portion is driven as the light blocking part, or in an environment in which the user requires high brightness, a voltage may be applied to drive the accommodating portion as the light transmitting part.

Therefore, since the light path control member according to the embodiment may be implemented in two modes according to the user's requirement, the light path control member may be applied regardless of the user's environment.

Hereinafter, a light path control member according to a fourth embodiment will be described with reference to FIGS. 17 to 30. In the description of the light path control member according to the fourth embodiment, descriptions of identical or similar elements to those of the light path control member according to the above-described embodiment will be omitted, and the same reference numerals will be assigned to the same compositions.

Figure 17:
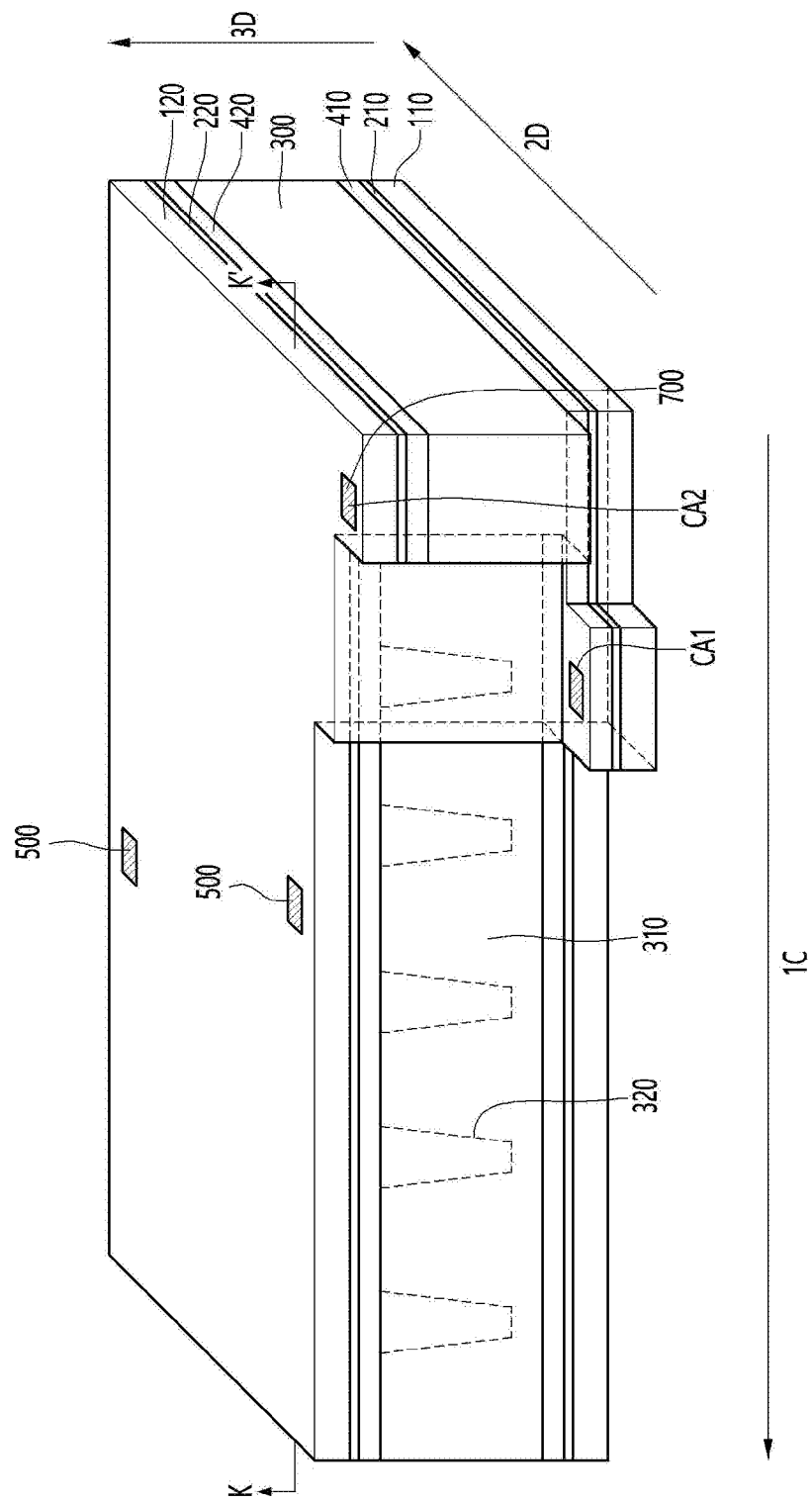
FIG. 17 is a perspective view of a light path control member according to a fourth embodiment.
Figure 18:
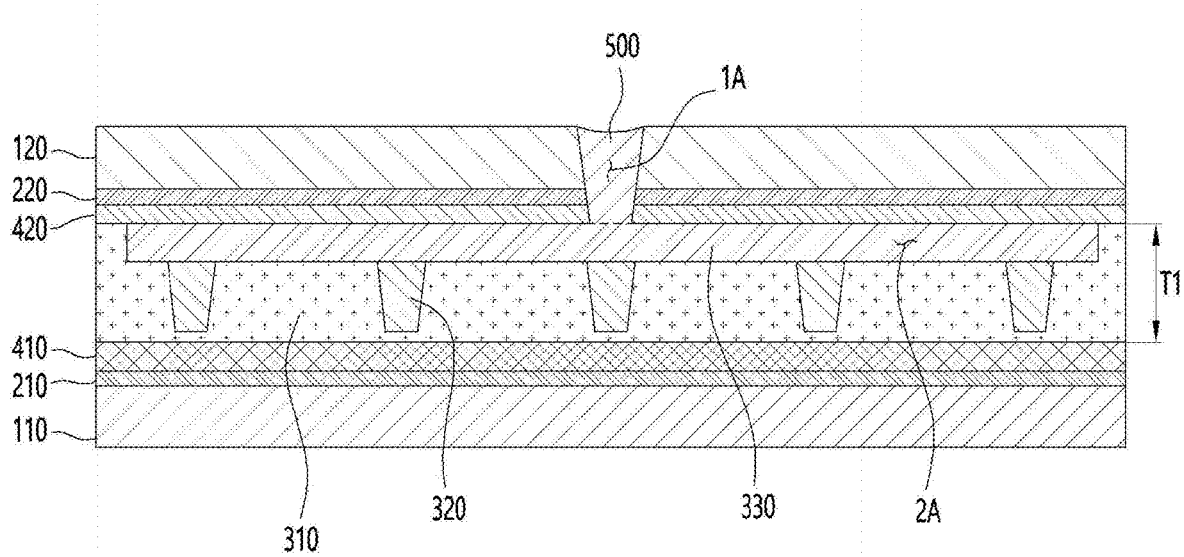
FIG. 18 is a cross-sectional view taken along area K-K' of FIG. 17.

Referring to FIGS. 17 and 18, the light path control member may include a first region 1A. The first region 1A may be formed by partially removing the second substrate 120, the second electrode 220, and the adhesive layer 420.

The light conversion unit 300 may be exposed by the first region 1A. The partition wall portion 310 and/or the accommodating portion 320 may be exposed by the sealing area SA.

In addition, a second region 2A may be formed in the light conversion unit 300. The second region 2A may extend in a direction different from that of the accommodating portion 320. The second region 2A may be disposed while crossing a plurality of partition wall portions 310 and accommodating portions 320.

The second region 2A may be formed by removing the partition wall portion 310. In detail, the second region 2A may be formed by removing the entire partition wall portion 310 or partially removing the partition wall portion 310. That is, the second region 2A may be defined as a region in which part or all of the partition wall portion 310 is removed.

Accordingly, the size of the partition wall portion 310 overlapping the second region 2A in the vertical direction and the size of the partition wall portion 310 not overlapping the second region 2A in the vertical direction may be different.

In detail, referring to FIG. 18, a thickness T1 of the partition wall portion 310 vertically overlapping the second region 2A may be smaller than a thickness T2 of the partition wall portion 310 not vertically overlapping the second region 2A. That is, the thickness T1 of the partition wall portion 310 vertically overlapping with the second region 2A may be smaller than the thickness T2 of the partition wall portion 310 not vertically overlapping with the second region 2A by a depth of the second region 2A.

The first region 1A and the second region 2A may be connected. In detail, an end of the first region 1A may be connected to the second region 2A. That is, the first region 1A and the second region 2A may be connected to each other to form one region. That is, the first region 1A and the second region 2A may be connected and integrally formed.

Also, the first region 1A and the plurality of accommodating portions 320 may be connected to each other. That is, the first region 1A and the plurality of accommodating portions 320 may be connected to each other.

The sealing part 500 may be disposed in the first region 1A. In addition, the light conversion material 330 may be disposed in the second region 2A.

That is, since the sealing part 500 is disposed in the first region 1A, the area in which the sealing part 500 is disposed may be minimized.

Accordingly, the process of forming the sealing part 500 may be facilitated, and an increase in the bezel area due to the area of the sealing part 500 may be inhibited.

In addition, contact between the sealing part 500 and the light conversion material 330 may be minimized. That is, since the sealing part 500 and the light conversion material 330 contact each other only in an area where the first region 1A and the second region 2A are connected, a contact area between the sealing part 500 and the light conversion material 330 may be minimized.

Accordingly, deterioration of the light conversion material 330 or the sealing part 500 due to contact between the sealing part 500 and the light conversion material 330 may be minimized.

Hereinafter, with reference to FIGS. 19 to 27, the above-described sealing part 500 will be described in more detail.

FIGS. 19 to 27 are views for explaining the first region and the second region of the light path control member according to an embodiment, and a process of disposing the light conversion material and the sealing part in the first region and the second region.

Figure 19:
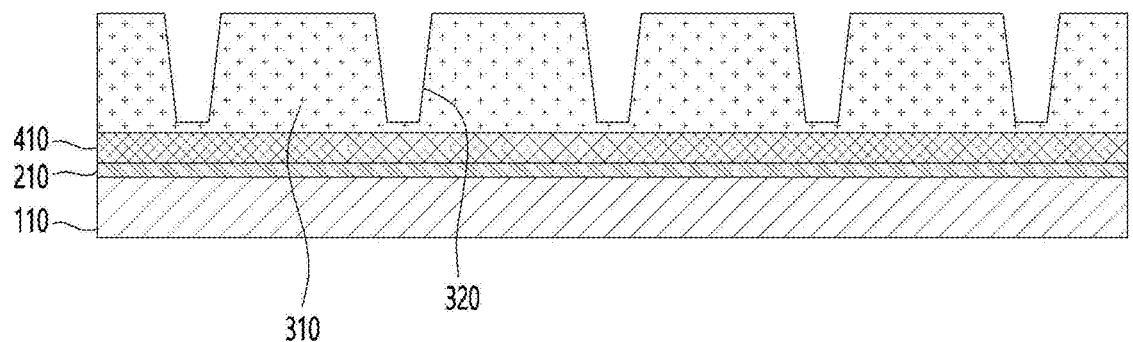
FIGS. 19 to 27 are views for explaining a method of forming a sealing part and a light conversion material of the light path control member according to the fourth embodiment.

Referring to FIG. 19, the partition wall portion 310 and the accommodating portion 320 may be formed on the first substrate 110. In detail, the first electrode 210 may be disposed on the first substrate 110, the buffer layer 410 for improving adhesion between the first electrode 210 and a resin material may be disposed on the first electrode 210, and the partition wall portion 310 and the accommodating portion 320 may be formed on the buffer layer 410. The partition wall portion 310 and the accommodating portion 320 may be formed by an imprinting process, but the embodiment is not limited thereto.

Figure 20:
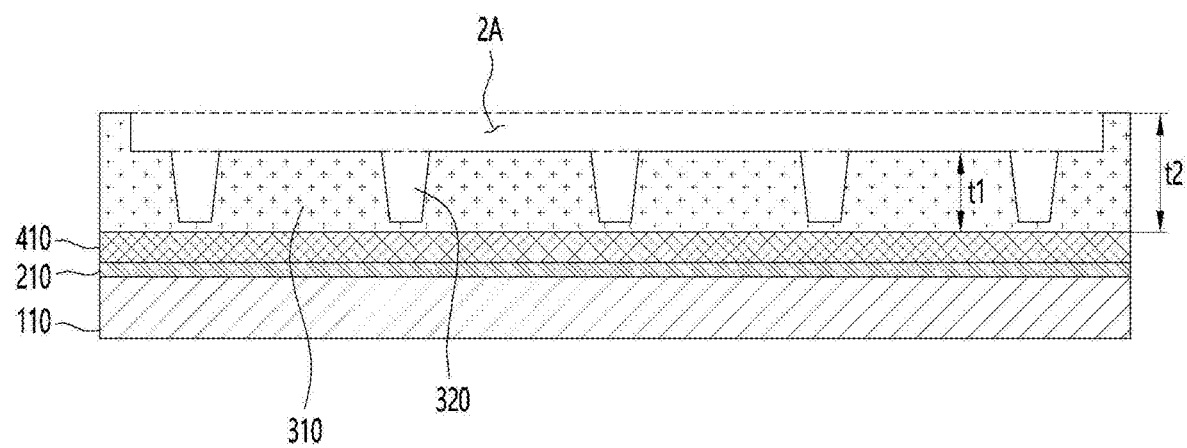

Referring to FIG. 20, the second region 2A may be formed by partially removing the partition wall portion 310. The second region 2A may be formed by partially removing the partition wall portion 310 to have a height of 20 μm or more. The second region 2A may be formed simultaneously when the partition wall portion 310 and the accommodating portion 320 are formed without a separate additional process.

When the second region 2A is formed to have a height of less than 20 when the light conversion material is injected into the accommodating portion 320 in a subsequent process, an injection space becomes smaller and the injection time increases, and thereby the process efficiency may be reduced.

By forming the second region 2A, the partition wall portion 310 overlapping the second region 2A and the partition wall portion 310 not overlapping the second region 2A may form a step in a direction in which the second region 2A extends. That is, a thickness t1 of the partition wall portion 310 overlapping the second region 2A may be smaller than a thickness t2 of the partition wall portion 310 not overlapping the second region 2A.

Figure 21:
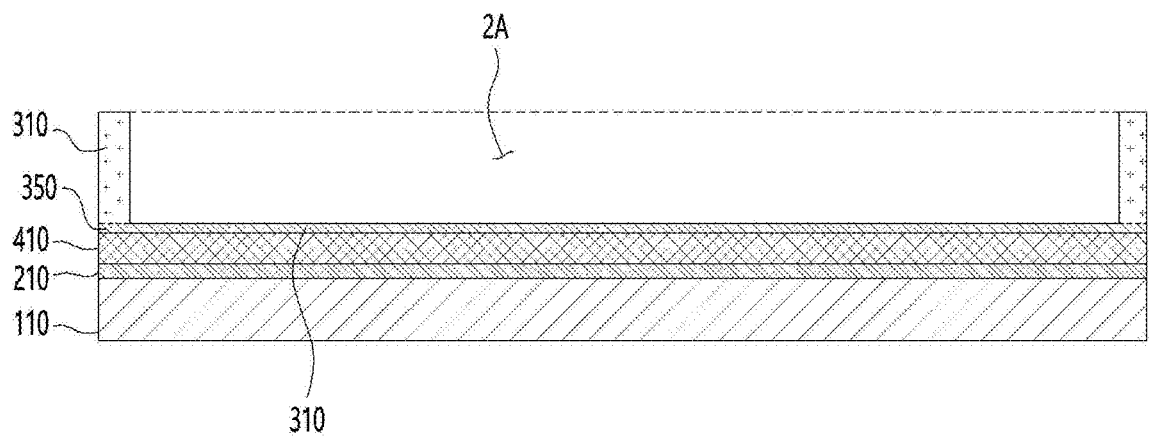

Alternatively, referring to FIG. 21, the second region 2A may be formed by removing all of the partition wall portion 310. That is, the second region 2A may be formed by entirely removing the partition wall portion 310 so that the thickness of the partition wall portion 310 is close to 0 μm. Accordingly, the base portion 350 may be exposed by the second region 2A.

Hereinafter, for convenience of description, a case in which the partition wall portion is partially removed as shown in FIG. 20 will be mainly described.

Figure 22:
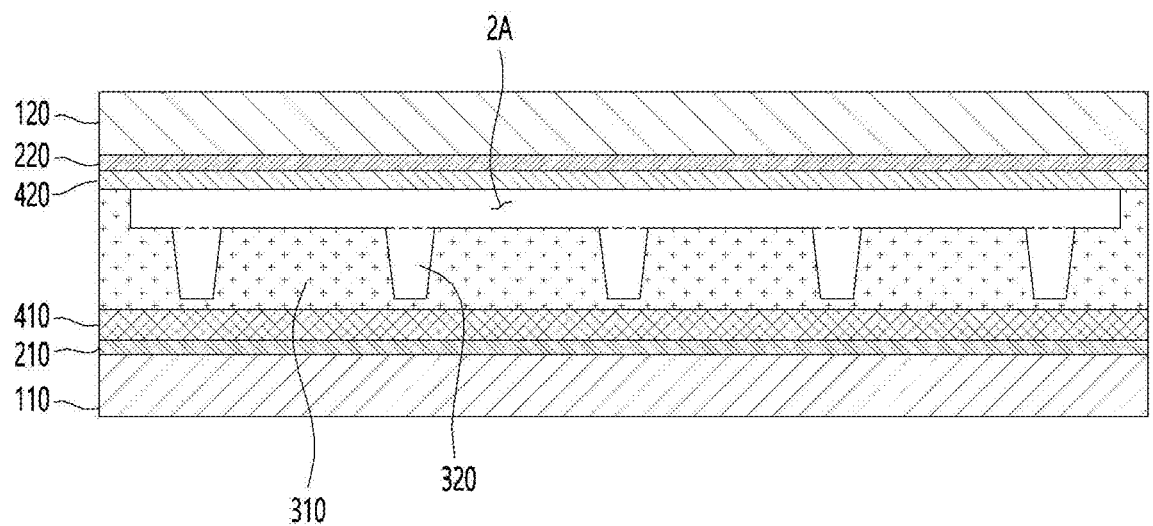

Referring to FIG. 22, the second substrate 120 and the second electrode 220 may be disposed on the partition wall portion 310 and the accommodating portion 320.

In detail, the second electrode 220 may be disposed under the second substrate 120, and the second electrode 220 and the partition wall portion 310 may be bonded to each other by the adhesive layer 420 disposed between the second electrode 220 and the partition wall portion 310.

Figure 23:
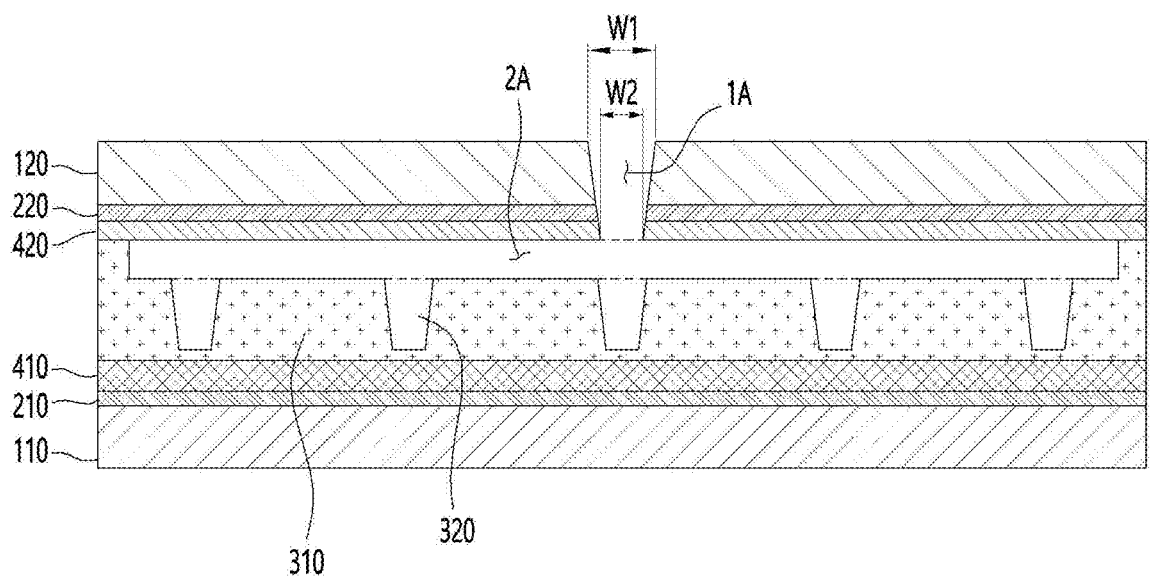

Referring to FIG. 23, the first region 1A may be formed by partially removing the second substrate 120, the second electrode 220, and the adhesive layer 420. The first region 1A may be formed to extend to a depth contacting the second region 2A.

Accordingly, the first region 1A and the second region 2A may be connected to each other. That is, the first region 1A and the second region 2A may be connected to each other.

An upper width W1 and a lower width W2 of the first region 1A may have different sizes. In detail, the upper width W1 may be greater than the lower width W2. Accordingly, when injecting the light conversion material 330 and the sealing material by the first region 1A, the materials may be easily injected.

In detail, the ratio of the upper width W1 to the lower width W2 may be 1:0.75 to 1:0.95. When the ratio of the upper width W1 to the lower width W2 is less than 1:0.75, the exit rate of the light conversion material 330 and the sealing material is slower than the injection rate, so that the material may overflow to the outside.

In addition, when the ratio of the upper width W1 to the lower width W2 exceeds 1:0.95, the exit rate of the light conversion material 330 and the sealing material is faster than the injection rate, so that air or the like may be introduced into the accommodating portion 320, and thereby the optical properties are reduced and defects may occur.

In addition, the upper width W1 and the lower width W2 may be 200 μm or more. In detail, the upper width W1 and the lower width W2 may be 200 μm to 500 μm. In more detail, the upper width W1 and the lower width W2 may be 220 μm to 480 μm.

When the upper width W1 and the lower width W2 are less than 200 μm, the injection space of the light conversion material and the sealing material through the first region 1A is reduced, so an injection process time may increase, and defects such as overflow may occur during injection. In addition, when the upper width W1 and the lower width W2 exceed 500 μm, the size of the sealing part 500 disposed in the first region 1A increases, so that an unnecessary bezel area may increase.

Figure 24:
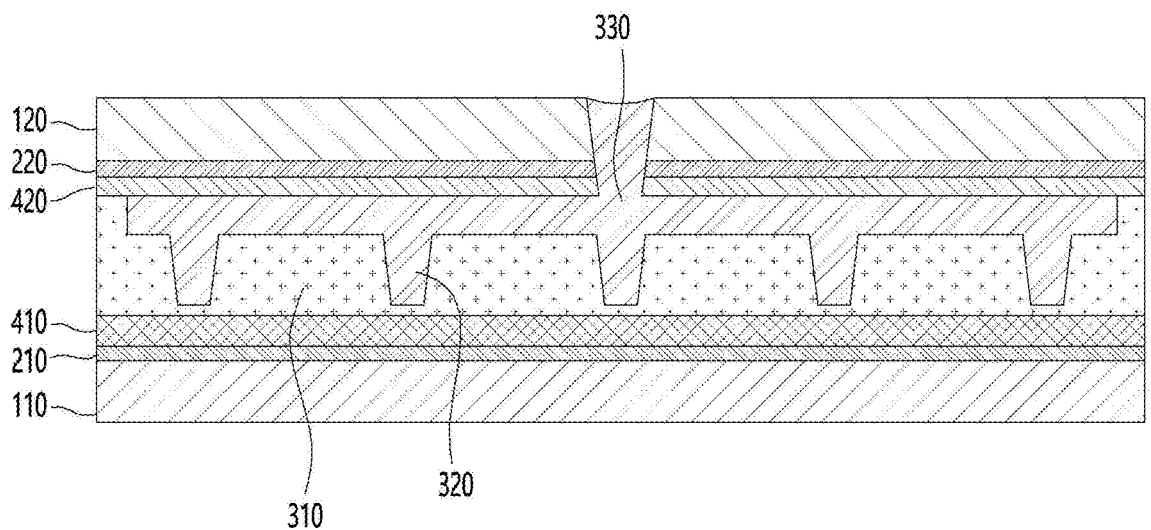
Figure 25:
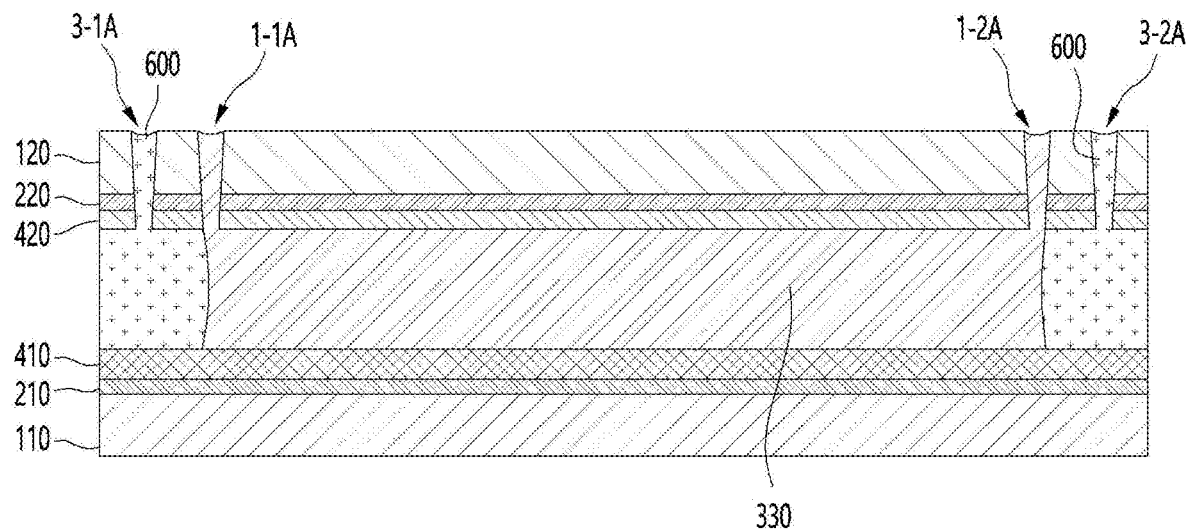

Referring to FIGS. 24 and 25, the light conversion material may be disposed inside the accommodating portion 320. FIG. 24 is a cross-sectional view taken along the first direction 1D of FIG. 17, and FIG. 25 is a cross-sectional view taken along the second direction 2D of FIG. 17.

First, referring to FIG. 24, the third region 3A may be formed by partially removing the second substrate 120, the second electrode 220, and the adhesive layer 420. The third region 3A may be disposed outside the first region 1A. Also, the third region 3A may be disposed to be spaced apart from the first region 1A and the second region 2A.

Also, referring to FIG. 24, the first region may include a 1-1 region 1-1A and a 1-2 region 1-2A facing each other in a direction in which the accommodating portion 320 extends, and the third region 3A may include a 3-1 region 3-1A and a 3-2 region 3-2A facing each other in a direction in which the accommodating portion 320 extends.

Accordingly, the 1-1 region 1-1A and the 1-2 region 1-2A may be disposed between the 3-1 region 3-1A and the 3-2 region 3-2A.

Subsequently, a dam portion 600 may be disposed in the third region 3A. In detail, the dam portion 600 may be disposed by disposing a resin material in the third region 3A. That is, the third region 3A may be a dam region.

Accordingly, one end and the other end of the accommodating portion 320 may be blocked by the dam portion 600.

The dam portion 600 may inhibit the light conversion material 330 from overflowing to the outside when the light conversion material 330 is disposed inside the accommodating portion 320. In addition, the dam portion 600 may seal one end and the other end of the light conversion material 330.

Next, referring to FIGS. 24 and 25, the light conversion material may be injected into the first region 1A. After defining any one of the 1-1 region 1-1A and the 1-2 region 1-2A as the injection part and defining the other region as the exit part, the light conversion material may be injected from the injection part toward the exit part.

For example, when the 1-1 region 1-1A is defined as the injection part and the 1-2 region 1-2A is defined as the exit part, the light conversion material 330 may be disposed inside the accommodating portion 320 by the capillary method of injecting the light conversion material 330 in the 1-1 region 1-1A and sucking the light conversion material 330 in the 1-2 region 1-2A.

Figure 26:
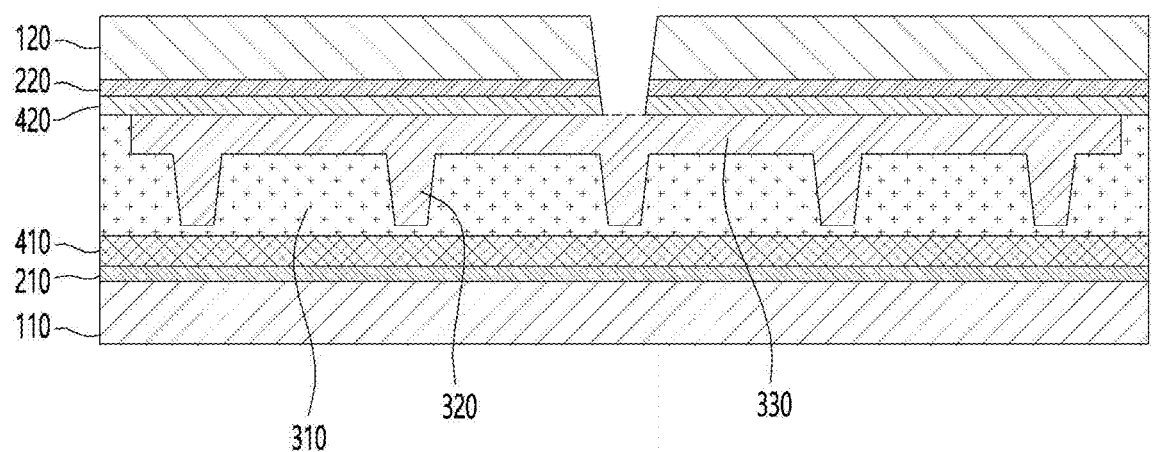

Referring to FIG. 26, the light conversion material of the first region 1A may be removed. In detail, after blocking the 1-2 region 1-2A so that the light conversion material inside the accommodating portion 320 is not moved, the 1-1 region 1-1A is cleaned, and after blocking the 1-1 region 1-1A, the 1-2 region 1-2A is cleaned, and thereby the light conversion material disposed inside the first region 1A may be removed.

Figure 27:
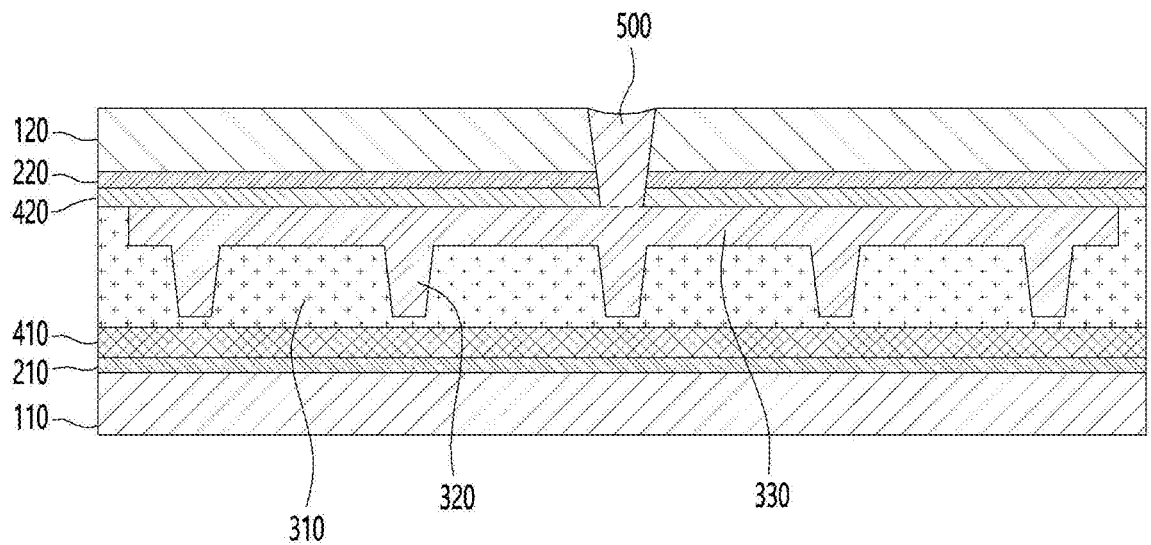

Referring to FIG. 27, a sealing part 500 may be formed by disposing a sealing material in the first region 1A.

Accordingly, since the sealing part 500 is disposed only in the first region 1A, an area occupied by the sealing part 500 may be reduced.

The light path control member according to the fourth embodiment may minimize the area where the sealing part is disposed. Accordingly, since the sealing part is disposed in a small area, the process of forming the sealing part may be facilitated.

In addition, since a contact area between the sealing part and the light conversion material is minimized, it is possible to inhibit a reduction in characteristics of the sealing part or the light conversion material due to a reaction between the sealing part and the light conversion material.

Figure 28:
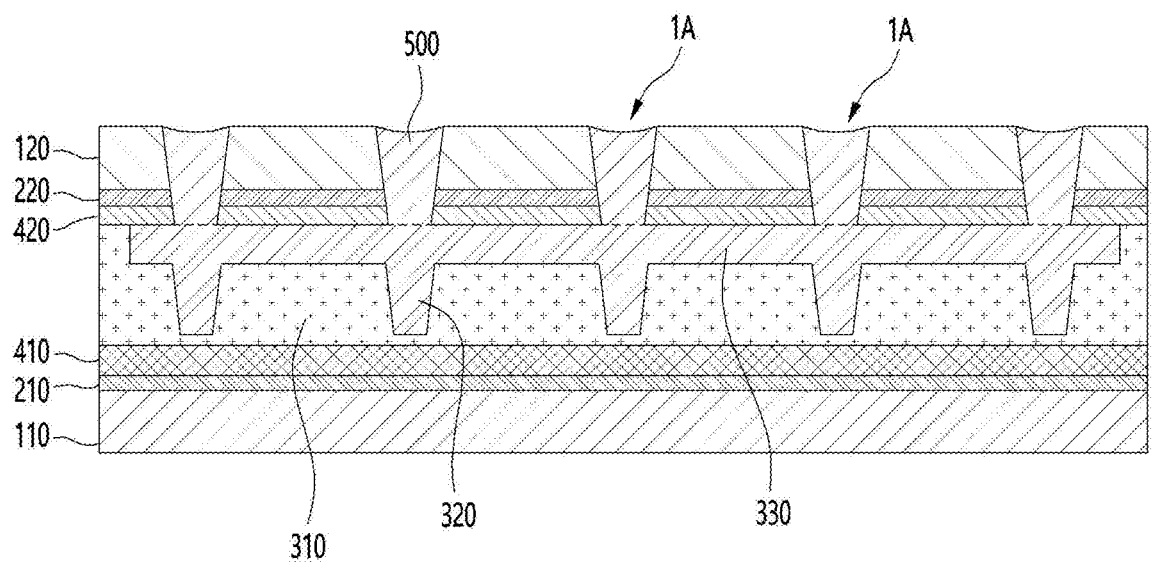
FIGS. 28 to 30 are various cross-sectional views of the light path control member according to the fourth embodiment.
Figure 29:
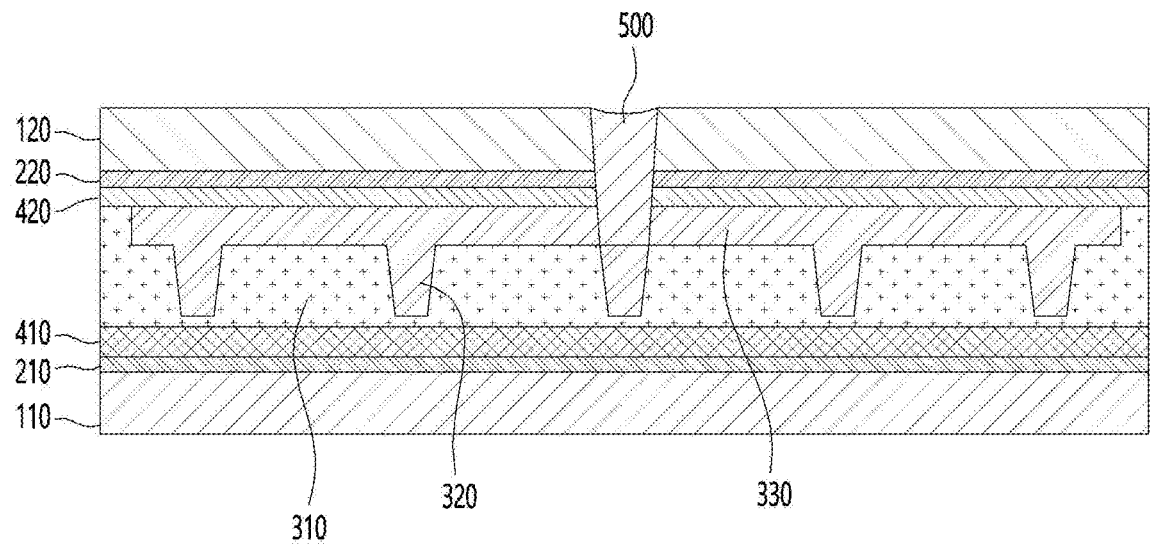
Figure 30:
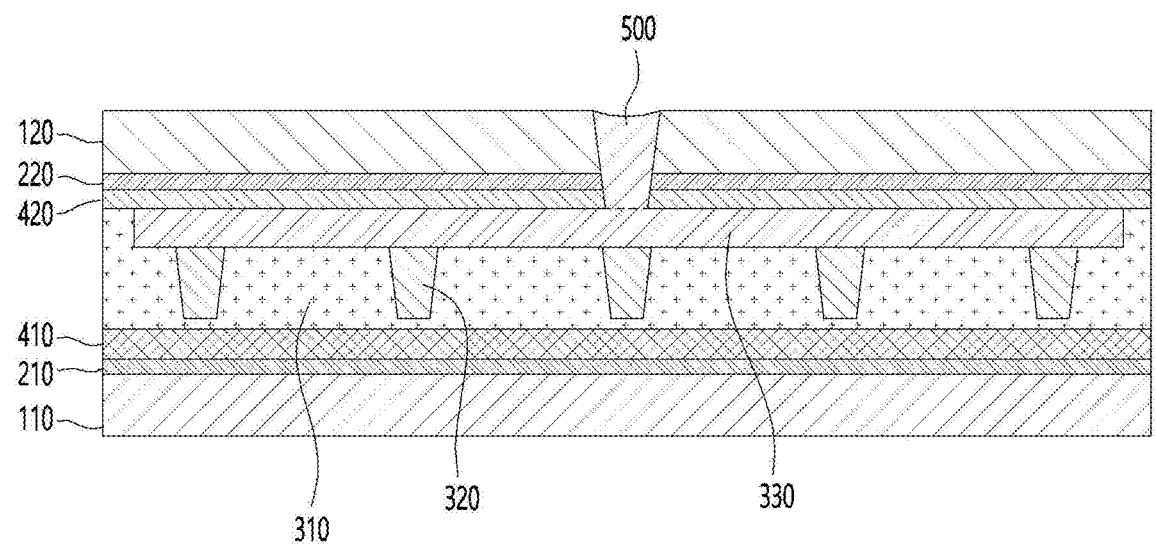

FIGS. 28 to 30 are cross-sectional views of light path control members according to various embodiments.

Referring to FIG. 28, the light path control member may include a plurality of first regions.

In detail, the light path control member may include a plurality of first regions formed by removing the second substrate 120, the second electrode 220, and the adhesive layer 420, and spaced apart from each other.

As described above, after injecting the light conversion material into the plurality of first regions 1A, the sealing part may be disposed by removing the light conversion material disposed on the first regions 1A.

Since the first region 1A includes a plurality of regions, an injection speed of the light conversion material may be increased. That is, since the light conversion material is injected into the plurality of regions, the injection speed of the light conversion material injected into the accommodating portion may be increased.

Referring to FIGS. 29 and 30, the sealing part 500 may also be disposed in the second region 2A. In detail, the sealing part 500 may be disposed in part or in the entirety of the second region 2A.

In detail, referring to FIG. 29, the sealing part 500 may be disposed in a part of the second region 2A. The sealing part 500 disposed in the second region 2A may be connected to and disposed with the sealing part 500 disposed in the first region 1A.

Alternatively, referring to FIG. 30, the sealing part 500 may be disposed on the entire second region 2A. That is, the sealing part 500 may be disposed in contact with the partition wall portion 310 in the second region 2A.

Since the sealing part 500 is also disposed in the second region 2A, adhesive properties of the sealing part 500 may be improved. In addition, the light conversion material may be effectively sealed by the sealing part.

Hereinafter, referring to FIGS. 31 to 35, a display device to which a light path control member according to an embodiment is applied will be described.

Figure 31:
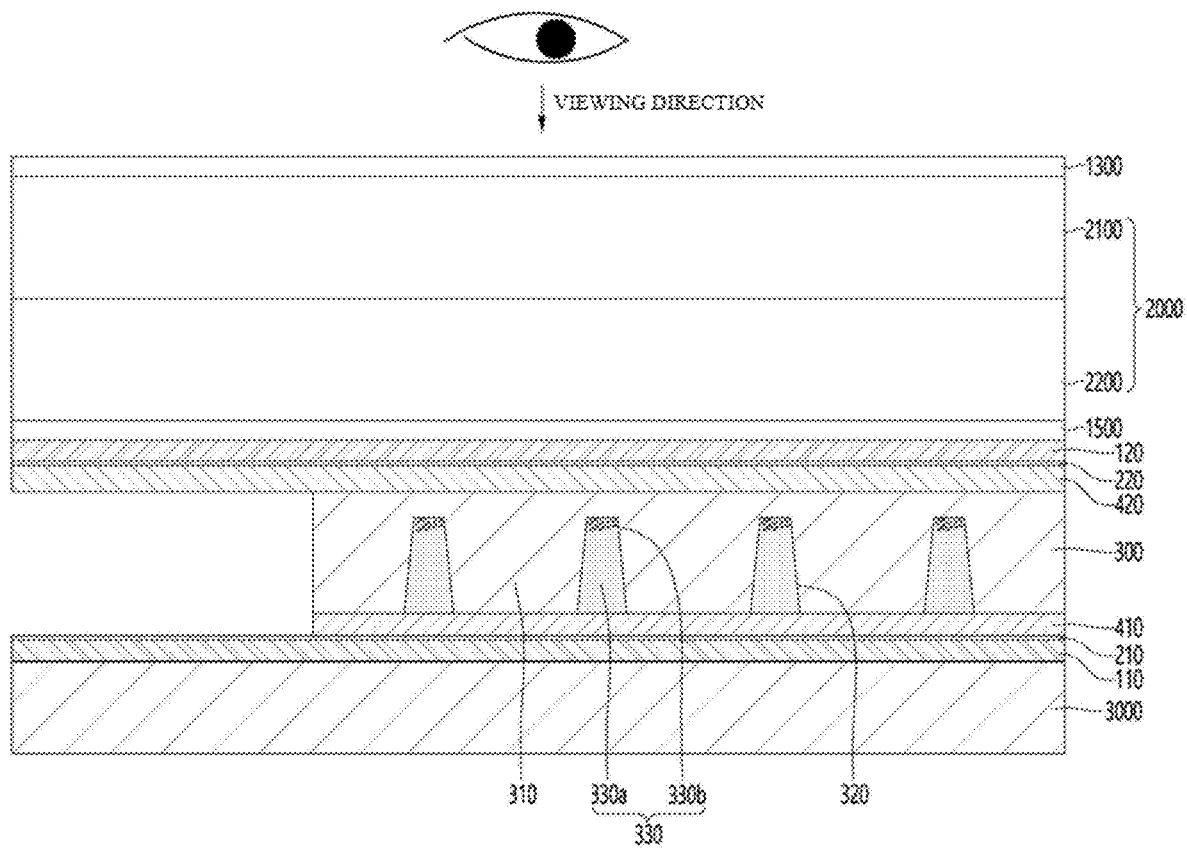
FIGS. 31 and 32 are cross-sectional views of a display device to which the light path control member according to the embodiment is applied.
Figure 32:
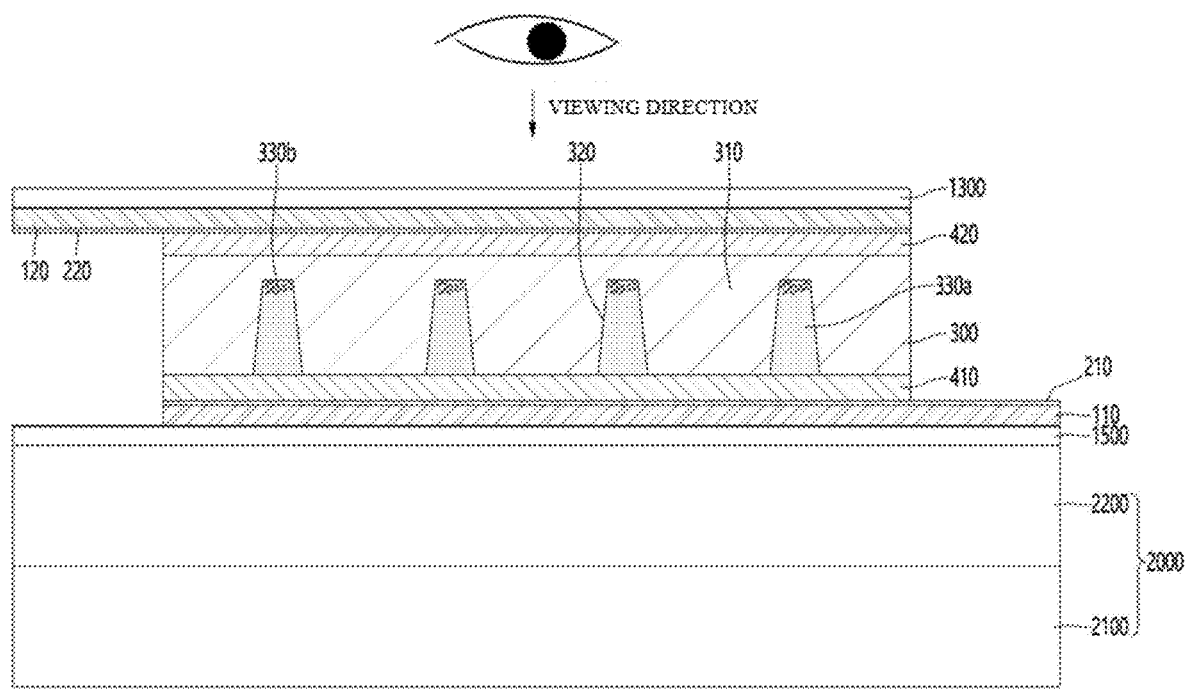

Referring to FIGS. 31 and 32, the light path control member 1000 according to an embodiment may be disposed on or under a display panel 2000.

The display panel 2000 and the light path control member 1000 may be disposed to be adhered to each other. For example, the display panel 2000 and the light path control member 1000 may be adhered to each other via an adhesive layer 1500. The adhesive layer 1500 may be transparent. For example, the adhesive layer 1500 may include an adhesive or an adhesive layer including an optical transparent adhesive material.

The adhesive layer 1500 may include a release film. In detail, when adhering the light path control member and the display panel, the light path control member and the display panel may be adhered after the release film is removed.

The display panel 2000 may include a first' substrate 2100 and a second' substrate 2200. When the display panel 2000 is a liquid crystal display panel, the light path control member may be formed under the liquid crystal panel. That is, when a surface viewed by the user in the liquid crystal panel is defined as an upper portion of the liquid crystal panel, the light path control member may be disposed under the liquid crystal panel. The display panel 2000 may be formed in a structure in which the first' substrate 2100 including a thin film transistor (TFT) and a pixel electrode and the second' substrate 2200 including color filter layers are bonded to each other with a liquid crystal layer interposed therebetween.

In addition, the display panel 2000 may be a liquid crystal display panel of a color filter on transistor (COT) structure in which a thin film transistor, a color filter, and a black electrolyte are formed at the first' substrate 2100 and the second' substrate 2200 is bonded to the first' substrate 2100 with the liquid crystal layer interposed therebetween. That is, a thin film transistor may be formed on the first' substrate 2100, a protective film may be formed on the thin film transistor, and a color filter layer may be formed on the protective film. In addition, a pixel electrode in contact with the thin film transistor may be formed on the first' substrate 2100. At this point, in order to improve an aperture ratio and simplify a masking process, the black electrolyte may be omitted, and a common electrode may be formed to function as the black electrolyte.

In addition, when the display panel 2000 is the liquid crystal display panel, the display device may further include a backlight unit 3000 providing light from a rear surface of the display panel 2000.

That is, as shown in FIG. 31, the light path control member may be disposed under the liquid crystal panel and on the backlight unit 3000, and the light path control member may be disposed between the backlight unit 3000 and the display panel 2000.

Alternatively, as shown in FIG. 32, when the display panel 2000 is an organic light emitting diode panel, the light path control member may be formed on the organic light emitting diode panel. That is, when the surface viewed by the user in the organic light emitting diode panel is defined as an upper portion of the organic light emitting diode panel, the light path control member may be disposed on the organic light emitting diode panel. The display panel 2000 may include a self-luminous element that does not require a separate light source. In the display panel 2000, a thin film transistor may be formed on the first' substrate 2100, and an organic light emitting element in contact with the thin film transistor may be formed. The organic light emitting element may include an anode, a cathode, and an organic light emitting layer formed between the anode and the cathode. In addition, the second' substrate 2200 configured to function as an encapsulation substrate for encapsulation may be further included on the organic light emitting element.

In addition, although not shown in drawings, a polarizing plate may be further disposed between the light path control member 1000 and the display panel 2000. The polarizing plate may be a linear polarizing plate or an external light reflection preventive polarizing plate. For example, when the display panel 2000 is a liquid crystal display panel, the polarizing plate may be the linear polarizing plate. Further, when the display panel 2000 is the organic light emitting diode panel, the polarizing plate may be the external light reflection inhibiting polarizing plate.

In addition, an additional functional layer 1300 such as an anti-reflection layer, an anti-glare, or the like may be further disposed on the light path control member 1000. Specifically, the functional layer 1300 may be adhered to one surface of the first substrate 110 of the light path control member. Although not shown in drawings, the functional layer 1300 may be adhered to the first substrate 110 of the light path control member via an adhesive layer. In addition, a release film for protecting the functional layer may be further disposed on the functional layer 1300.

Further, a touch panel may be further disposed between the display panel and the light path control member.

It is illustrated in the drawings that the light path control member is disposed at an upper portion of the display panel, but the embodiment is not limited thereto, and the light path control member may be disposed at various positions such as a position in which light is adjustable, that is, a lower portion of the display panel, or between a second substrate and a first substrate of the display panel, or the like.

In addition, it is shown in the drawings that the light conversion unit of the light path control member according to the embodiment is in a direction parallel or perpendicular to an outer surface of the second substrate, but the light conversion unit is formed to be inclined at a predetermined angle from the outer surface of the second substrate. Through this, a moire phenomenon occurring between the display panel and the light path control member may be reduced.

Figure 33:
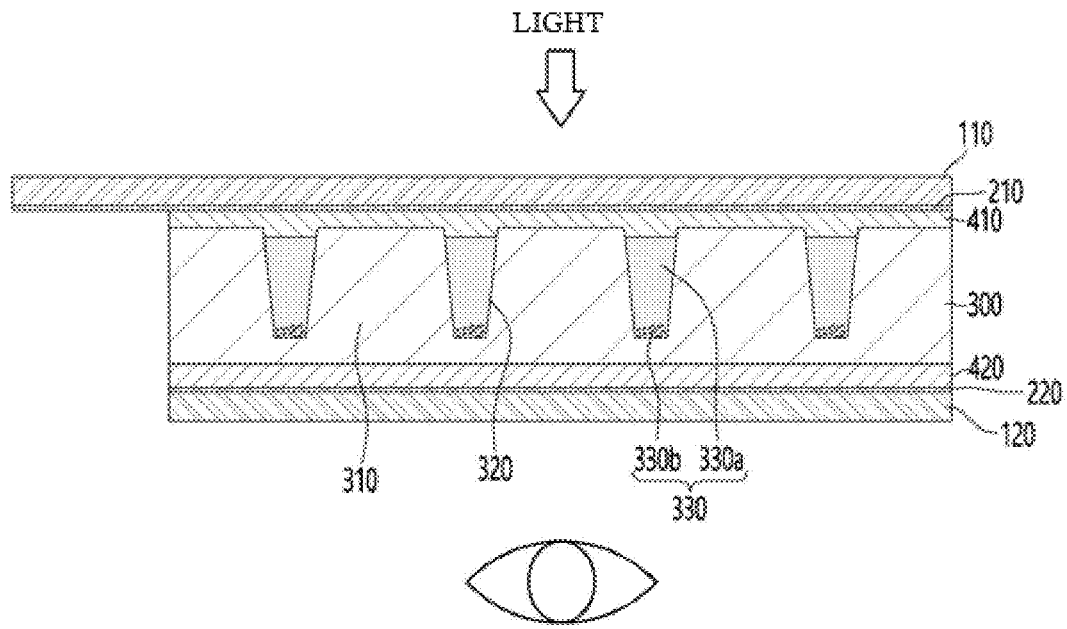
FIGS. 33 to 35 are views for explaining one embodiment of the display device to which the light path control member according to the embodiment is applied.
Figure 33:
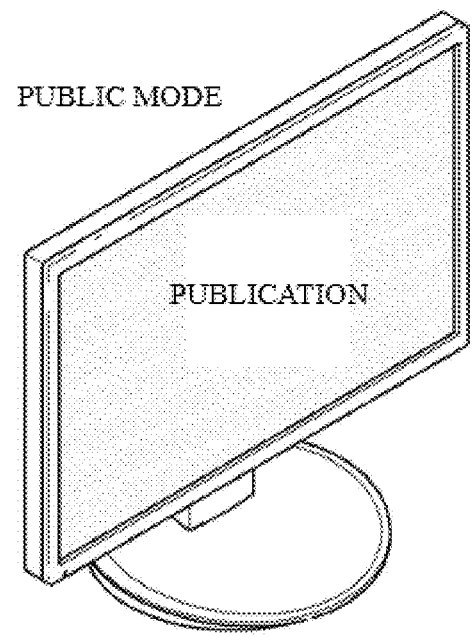
Figure 34:
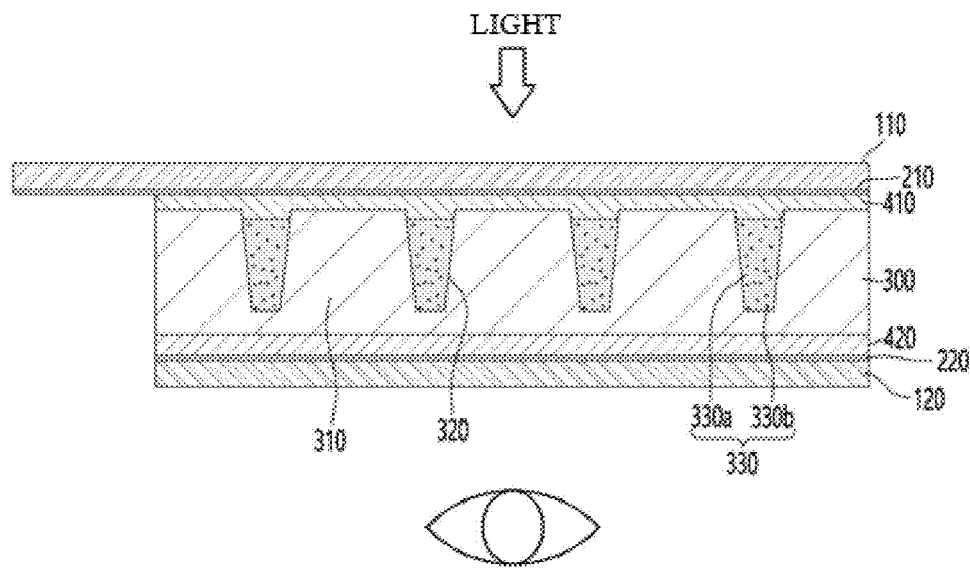
Figure 34:
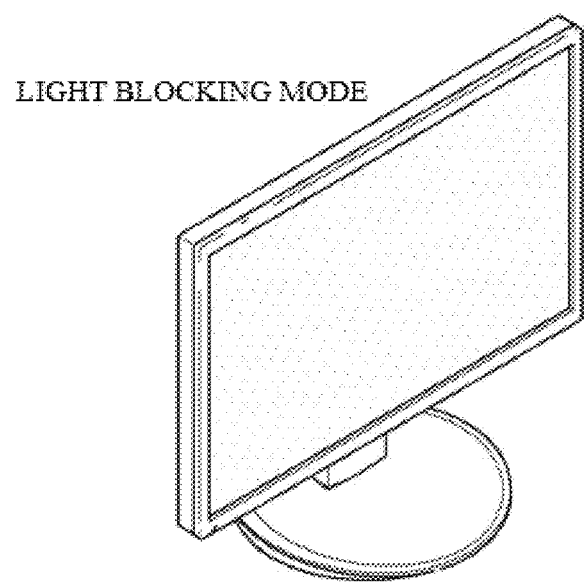
Figure 35:

Referring to FIGS. 33 to 35, a light path control member according to an embodiment may be applied to various display devices.

Referring to FIGS. 33 to 35, the light path control member according to the embodiment may be applied to a display device that displays a display.

For example, when power is applied to the light path control member as shown in FIG. 33, the accommodation part functions as the light transmitting part, so that the display device may be driven in the public mode, and when power is not applied to the light path control member as shown in FIG. 34, the accommodation part functions as the light blocking part, so that the display device may be driven in the light blocking mode.

Accordingly, a user may easily drive the display device in a privacy mode or a normal mode according to application of power.

Light emitted from the backlight unit or the self-luminous element may move from the first substrate toward the second substrate. Alternatively, the light emitted from the backlight unit or the self-luminous element may also move from the second substrate toward the first substrate.

In addition, referring to FIG. 35, the display device to which the light path control member according to the embodiment is applied may also be applied inside a vehicle.

For example, the display device including the light path control member according to the embodiment may display a video confirming information of the vehicle and a movement route of the vehicle. The display device may be disposed between a driver seat and a passenger seat of the vehicle.

In addition, the light path control member according to the embodiment may be applied to a dashboard that displays a speed, an engine, an alarm signal, and the like of the vehicle.

Further, the light path control member according to the embodiment may be applied to a front glass (FG) of the vehicle or right and left window glasses.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. A light path control member comprising:
a first substrate;
a first electrode disposed on the first substrate;
a second substrate disposed on the first substrate;
a second electrode disposed under the second substrate;
a light conversion unit disposed between the first electrode and the second electrode;
an adhesive layer between the second electrode and the light conversion unit; and
a buffer layer between the first electrode and the light conversion unit,
wherein the light conversion unit includes a plurality of partition wall portions, an accommodating portion, and a base portion,
wherein a light conversion material is disposed in the accommodating portion,
wherein a sealing region is formed on at least one of the first substrate and the second substrate,
wherein the accommodating portion extends in a second direction,
wherein a moving part connected to the accommodating portion and extending in a first direction different from the second direction,
wherein the moving part is connected to the sealing region and the accommodating portion,
wherein the sealing region is formed through the first substrate, the first electrode, and the buffer layer or through the second substrate, the second electrode, and the adhesive layer,
wherein the sealing region overlaps the moving part.

2. The light path control member of claim 1, wherein a depth of the moving part is 80% to 120% of the depth of the accommodating portion.

3. The light path control member of claim 1, wherein the sealing region includes a first sealing region and a second sealing region,
wherein the first sealing region and the second sealing region are disposed to face each other.

4. The light path control member of claim 3, wherein a first sealing part is disposed in the first sealing region,
wherein a second sealing part is disposed in the second sealing region.

5. The light path control member of claim 3, wherein a width of the first sealing region is different from a width of the first moving part.

6. The light path control member of claim 5, wherein the width of the first sealing region is smaller than the width of the first moving part.

7. The light path control member of claim 1, wherein the sealing region includes a first sealing region and a second sealing region,
wherein the moving part includes a first moving part and a second moving part facing each other in a second direction,
wherein the first sealing region is disposed at one end or an other end of the first moving part,
wherein the second sealing area is disposed at one end or an other end of the second moving part.

8. The light path control member of claim 1, wherein a light conversion material is disposed in the accommodating portion,
wherein a side surface portion is disposed outside the first moving part and outside the second moving part,
wherein the first moving part and the second moving part are disposed between the side surface portion and the accommodating portion.

9. The light path control member of claim 8, wherein a maximum width of the side surface portion is different from maximum widths of the first moving part and the second moving part.

10. The light path control member of claim 9, wherein the maximum width of the side surface part is smaller than maximum widths of the first moving part and the second moving part.

11. The light path control member of claim 8, wherein the side surface portion includes a same material as the partition wall portion.

12. A display device comprising:
a panel including at least one of a display panel and a touch panel; and
the light path control member of claim 1, which is disposed on or under the panel.

13. The light path control member of claim 1, wherein a width of the moving part and a width of the accommodating portion are different.

14. The light path control member of claim 13, wherein the width of the moving part is greater than the width of the accommodating portion.

15. The light path control member of claim 1, wherein the light conversion material is disposed on the moving part.

16. The light path control member of claim 1, wherein the moving part is formed by removing part or all of the partition wall portion.

17. The light path control member of claim 1, wherein the second direction in which the accommodating portion extends is inclined at an acute angle with respect to the first direction in which the moving part extends.

18. The light path control member of claim 17, wherein the accommodating portion is formed in plurality,
wherein one end of the outermost accommodating portion of the plurality of accommodating portions is in contact with the first moving part, and an other end is spaced apart from the second moving part.

* * * * *